US00RE37599E

(19) United States
(12) Reissued Patent
Lau et al.

(10) Patent Number: US RE37,599 E
(45) Date of Reissued Patent: Mar. 19, 2002

(54) POLY(ARYLENE ETHER) COMPOSITIONS AND THE METHOD FOR THEIR MANUFACTURE

(75) Inventors: Kreisler Lau, Sunnyvale; Neil Hendricks, Sonora; William Wan, Mountain View; Aaron Smith, Ben Lomond, all of CA (US)

(73) Assignee: AlliedSignal Inc., Morristown, NJ (US)

(21) Appl. No.: 09/659,380

(22) Filed: Sep. 8, 2000

Related U.S. Patent Documents

Reissue of:
(64) Patent No.: 5,986,045
Issued: Nov. 16, 1999
Appl. No.: 08/665,132
Filed: Jun. 14, 1996

U.S. Applications:
(60) Provisional application No. 60/000,514, filed on Jun. 26, 1995.

(51) Int. Cl.[7] ..... C08G 73/24
(52) U.S. Cl. ..... 528/401; 528/86; 528/503; 428/195; 428/209; 428/421; 428/901
(58) Field of Search ..... 528/401, 86, 503; 428/195, 209, 421, 901

(56) References Cited

U.S. PATENT DOCUMENTS

| | | | | |
|---|---|---|---|---|
| 4,252,937 A | 2/1981 | Marvel et al. | ..... | 528/126 |
| 4,683,340 A | 7/1987 | Lindley et al. | ..... | 568/331 |
| 5,108,840 A | 4/1992 | Mercer | ..... | 428/411.1 |
| 5,114,780 A | 5/1992 | Mercer et al. | ..... | 428/195 |
| 5,145,936 A | 9/1992 | Mercer | ..... | 528/86 |

FOREIGN PATENT DOCUMENTS

| | | |
|---|---|---|
| EP | 0-373-784 | 6/1990 |
| WO | WO 91/09070 | 6/1991 |
| WO | WO 91/09071 | 6/1991 |
| WO | WO 91/16370 | 10/1991 |

OTHER PUBLICATIONS

Polymeric Materials Sci. & Eng., vol. 66, 1992, pp. 198–199, Mercer et al.., "Low Dielectric Constant Fluorinated Aryl Ethers".

Journal Polym. Sci. : Part A : Polymer Chemistry, vol. 29, 1991,pp. 1061–1071, Lindley et al., "Intramolecular Cyclization of Pendant Phenylethynyl Groups".

*Primary Examiner*—Duc Truong
(74) *Attorney, Agent, or Firm*—Fish & Associates, LLP; Robert D. Fish

(57) ABSTRACT

A method is disclosed for making hydroxy-substituted ethynylated biphenyl compounds and for reacting such compounds with a family of noncross-linking thermosetting poly(arylene ethers) to produce novel poly(arylene ether) compositions which, when cured at glass transition temperatures greater than about 350° C. to form thin films, possess properties such as low dielectric constant, low moisture absorption, and high thermal stability. These films are suitable for use as intermetal dielectrics for multilevel interconnection.

41 Claims, 5 Drawing Sheets

POLY(ARYLENE ETHER) COMPOSITIONS AND THE METHOD FOR THEIR MANUFACTURE

Matter enclosed in heavy brackets [ ] appears in the original patent but forms no part of this reissue specification; matter printed in italics indicates the additions made by reissue.

CROSS-REFERENCE TO RELATED APPLICATION

This application claims the benefit of provisional application number 60/000,514 filed on Jun. 26, 1995, which is incorporated herein by reference.

BACKGROUND OF THE INVENTION

1. Field of the Invention

The present invention relates to fluorinated poly(arylene ether) compositions for use in coating microelectronic structures, such as integrated circuits, and the method for their manufacture. More particularly, this invention relates to the use of novel bisphenol reactants in the method of manufacturing novel poly(arylene ether) compositions which possess improved properties such as higher glass transition temperature and lower dielectric constant.

2. Background of the Invention

Fluorinated poly(arylene ethers) based upon decafluorobiphenyl have been used extensively as replacements for polyimides for use in spin-coating substrates, such as multichip modules, printed circuit boards, integrated circuits and other microelectronic devices in intermetal dielectric production. These fluorinated poly(arylene ethers), which are commercially available from AlliedSignal Inc. under the tradename "FLARE™", not only exhibit a thermal stability comparable to that of polyimides but also possess about ten to forty times lower moisture absorption rate, a dielectric constant in the range of about 2.35 to about 2.65, and good retention of storage modulus above their glass transition temperature ("Tg"). These properties are relevant not only to enhanced circuit performance, i.e. higher speed, lower power consumption, and reduced signal-to-noise ratios, but also to lower processing costs. By highly cross-linking these compounds with cross-linking agents or cross-linkable pendent groups, their performance may be enhanced under process integration conditions, i.e. a Tg increase to greater than about 300° C. See Lau, A. N. K., et al., Am. Chem. Soc., Polymer Preprints, 33(1), 996–997 (1992).

Also well-known in the art are methods for synthesizing ethynylated biphenyl monomers such as 2,2'-bis (phenylethynyl)-5,5'-diaminobiphenyl by first producing 2,2'-diiodo-5,5'dimethoxybiphenyl from 3,3'-dimethoxybiphenyl. See Lindley, P. M., et al., in J. Polym. Sci., Part A: Polym. Chem., 1061–1071 (1991) and U.S. Pat. No. 4,683,340 to Lindley, et al. [together hereinafter referred to as "Lindley"]. However, the yield of ethylnylated aromatic compounds produced therefrom is very low, i.e. 4% to 14%.

It is further well known in the art to incorporate such ethynylated biphenyl monomers such as 2,2'-bis (phenylethynyl)-5,5'-diaminobiphenyl and 2,2'-bis (phenylethynyl)-5,5'-diaminobenzidine in the synthesis of high-temperature resistant, high-performance polyphenylquinoxalines and polybenzimidazoles. However, such methods are also laborious, costly, and low-yielding. See Lau, K. S. Y., "Chemistry, Characterization, and Processing of IMC Curing Polymers," Final Report, Air Force Contract F33615-79-C-5101, for period of September, 1979 to June, 1983, Hughes Aircraft Company (1983).

It would be desirable to provide an improved fluorinated poly(arylene ether) composition which would possess a Tg in excess of about 300° C. without having to highly cross-link the compound or include cross-linkable pendent groups as well as without sacrificing any of the other properties associated with known fluorinated poly(arylene ether) compounds. It would also be desirable to provide an economical, high-yielding process for producing such compositions.

SUMMARY OF THE INVENTION

In accordance with this invention, there is provided a novel composition of Formula C:

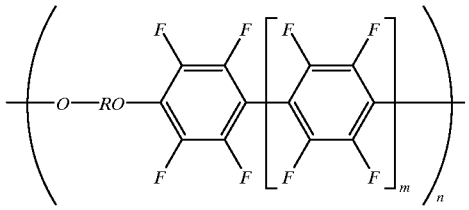

wherein

R is an aromatic nucleus which imparts a glass transition temperature of greater than 260° C. to the composition;

m is an integer of from about 0 to about 50; and n is an integer of from about 1 to about 200.

In accordance with another aspect of this invention, there is provided a process for manufacturing the above composition comprising:

reacting a compound of Formula A

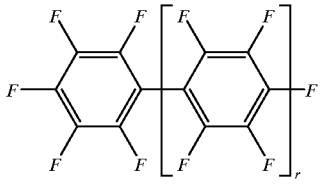

wherein r is an integer of from about 0 to about 50, or a compound of Formula D

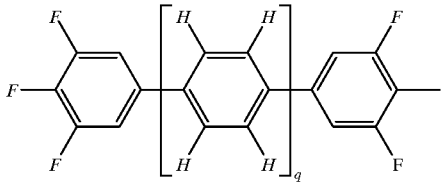

wherein q is an integer of from about 0 to about 49, with a compound of Formula B

HO—R—OH wherein

R is an aromatic nucleus which imparts a glass transition temperature of greater than 260° C. to the composition under conditions sufficient to produce the composition.

This invention is also directed to a process for producing a fluorinated poly(arylene ether) mixture suitable for spin-coating onto a substrate comprising:

a) forming a solution from a composition of Formula C

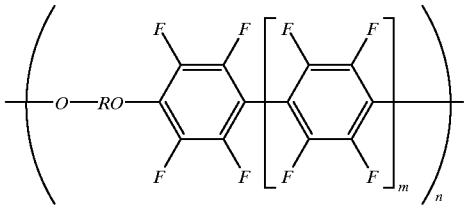

wherein

R is an aromatic nucleus which imparts a glass transition temperature of greater than 260° C. to the composition;

m is an integer of from about 0 to about 50; and n is an integer of from about 1 to about 200 and an aprotic solvent; and b) filtering the solution through at least one filter having a pore size of about 0.1 micrometers.

This invention is also directed to a process for producing a cured, coated substrate comprising:

a) forming a solution from a composition of Formula C

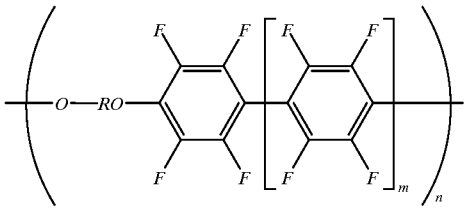

wherein

R is an aromatic nucleus which imparts a glass transition temperature of greater than 260° C. to the composition;

m is an integer of from about 0 to about 50; and n is an integer of from about 1 to about 200;

and an aprotic solvent;

b) filtering the solution;

c) applying the solution of step b onto a substrate to form a film thereon; and d) heating the film of step c under conditions sufficient to cure the film.

Another embodiment of the invention is directed to a process for making ethynylated, hydroxy-substituted biphenyl compounds comprising:

a) halogenating 3,3'-dimethoxybiphenyl under conditions sufficient to form 2,2'-dihalo-5,5'-dimethoxybiphenyl;

b) reacting said 2,2'dihalo-5,5'-dimethoxybiphenyl with a bromide containing compound in a chlorinated solvent under conditions sufficient to form 2,2'-dihalo-5,5'-dihydroxybiphenyl;

c) reacting said 2,2'-dihalo-5,5'-dihydroxybiphenyl with a hydroxyl-containing compound in the presence of a protection catalyst under conditions sufficient to form 2,2'-dihalo-5,5'-bis(tetrahydropyranoxy)biphenyl;

d) ethynylating said 2,2'-dihalo-5,5'-bis(tetrahydropyranoxy)biphenyl with a compound of the formula $$CuC{\equiv}CR'$$

wherein R' is comprised of an alkyl group having from about 1 to about 20 carbon atoms, an alkenyl group having from about 1 to about 20 carbon atoms, an aryl group, a heteroaryl group, and derivatives or mixtures thereof to form 2,2'-bis(C≡CR')-5,5'-bis(tetrahydropyranoxy)biphenyl; and e) hydrolyzing said 2,2'-bis(C≡CR')-5,5'-bis(tetrahydropyranoxy)biphenyl under conditions sufficient to form 2,2'-bis(C≡CR')-5,5'-bis(dihydroxy)biphenyl, wherein R' is as described in step d.

The poly(arylene ether) compositions of this invention not only possess a Tg in excess of about 350° C. without having to highly cross-link the compound or include cross-linkable pendent groups thereto as well as without sacrificing any of its other properties such as solubility, spin-coatability, high thermal stability, low moisture absorptivity, low dielectric constant, and planarizability.

BRIEF DESCRIPTION OF THE DRAWINGS

The invention will be more fully understood and further advantages will become apparent when reference is made to the following detailed description of the preferred embodiments of the invention and the accompanying drawings, in which:

FIG. 4b illustrates an enlarged view of the second scan of FIG. 4a.

DESCRIPTION OF THE PREFERRED EMBODIMENTS

Figure 1:
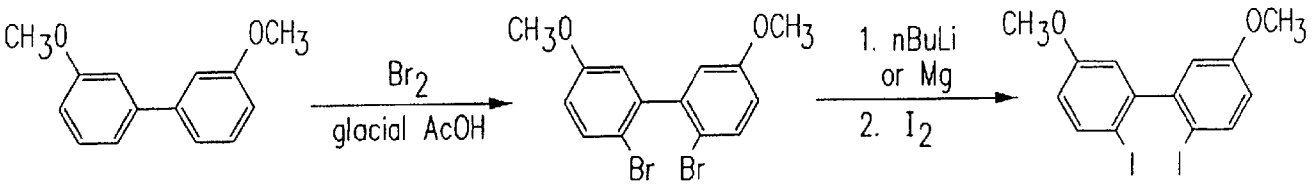
FIG. 1 illustrates a method for the synthesis of 2,2'-Diiodo-5,5'-dimethoxybiphenyl.
Figure 3:
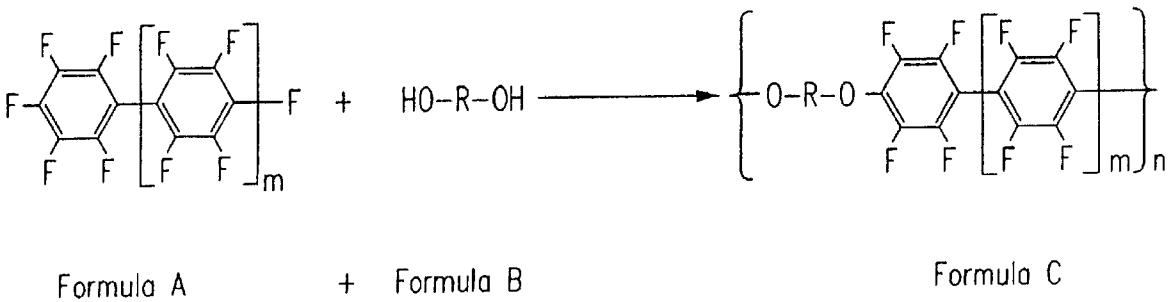
FIG. 3 illustrates a method for synthesizing poly(arylene ether) compositions according to the process of the present invention.

Unless indicated otherwise, all references herein are specified in weight. As used herein, "glacial" means the absence of water or undiluted. Although the below-described reactions may be conducted in any type of conventional round-bottom reaction vessels, it is preferable to use a nonmetallic-lined vessels.

The ethynylated aromatic compound starting materials, which are preferably ethynylated hydroxy-substituted biphenyl ("bisphenol") compounds corresponding to Formula B $$HO{-}R{-}OH$$

wherein

R is an aromatic nucleus that imparts a Tg of greater than about 260° C., and preferably from about 350° C. to about 450° C., to the compounds which contain them, are either commercially available and/or may readily be synthesized by one skilled in the art without undue experimentation based upon a conventional boron tribromide demethylation reaction of the R groups with methoxy substituents. Details of such reactions are well-known in the art and described at, for example, McOmie, J. F. W., et al., 24 Tetrahedron 2289–2292 (1972) [hereinafter "McOmie"].
Examples of suitable R groups include
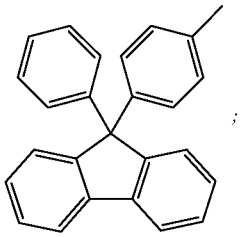
;
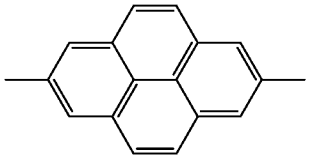
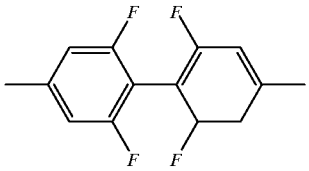
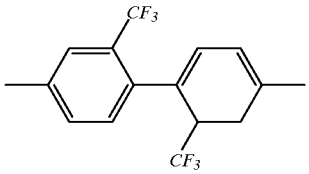
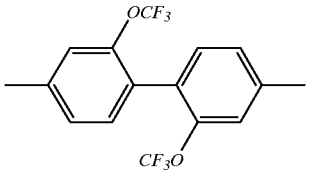
;
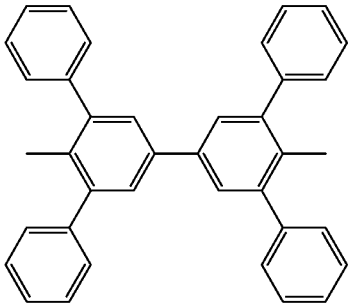
;
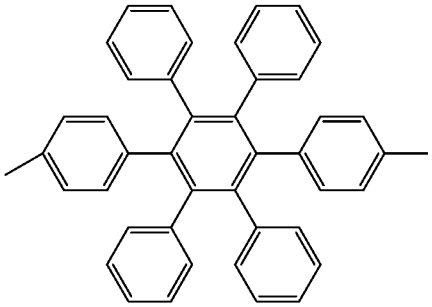
;
-continued
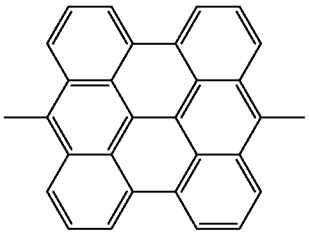
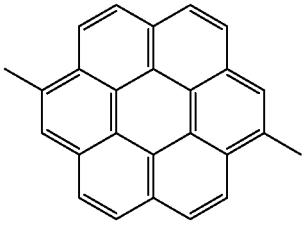
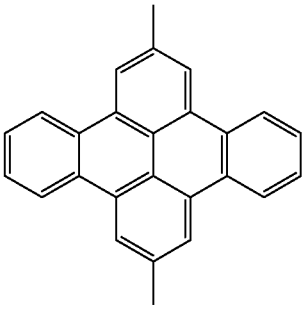
;
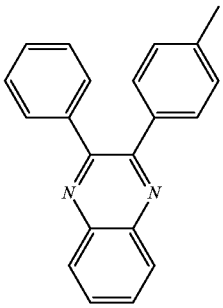
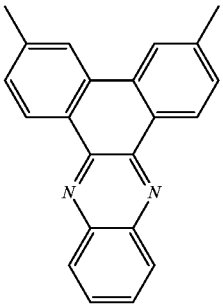

-continued

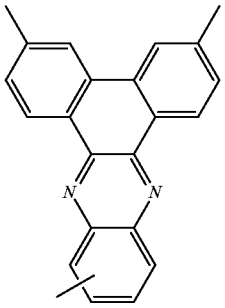

;

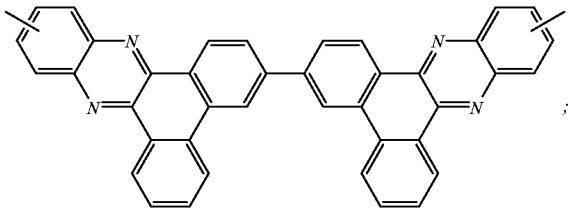

;

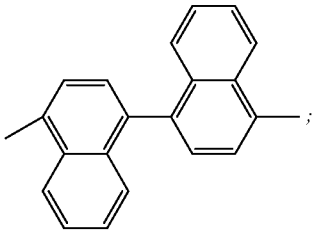

;

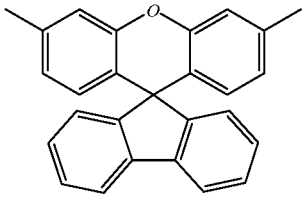

;

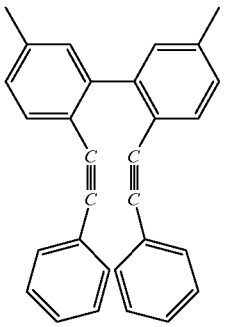

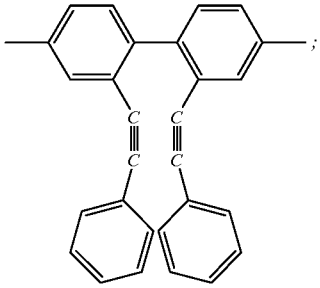

;

or mixtures thereof. Preferred bisphenol compounds include

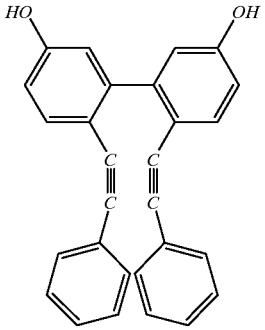

and 2,2'-bis(phenylethynyl)-5,5'-dihydroxybiphenyl

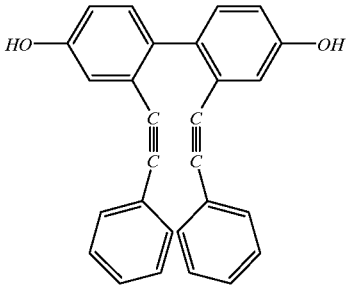

2,2'-bis(phenylethynyl)-4,4'-dihydroxybiphenyl, with 2,2'-bis(phenylethynyl)-5,5'- dihydroxybiphenyl being most preferred.

In a preferred embodiment for producing ethnylated aromatic compounds, commercially available 3,3'-dimethoxy-4,4'-diaminobiphenyl ("o-dianisidine"), is diazotized under conditions sufficient to form 3,3'-dimethoxybiphenyl. Details of this reaction are well known in the art and are described in, for example, U.S. Pat. No. 3,320,320 to Kamlet et al., which is incorporated herein by reference; Organic Synthesis 30–55 (N.Y. 1941); and Organic Synthesis Collective Volume III, 295–299 (1955).

The 3,3'-dimethoxybiphenyl is converted into 2,2'-dihalo-5,5'-dimethyoxybiphenyl, and preferably 2,2'-diiodo-5,5'-dimethyoxy-biphenyl, via an initial reaction with a halogen such as chlorine or bromine, and preferably bromine, miscible in glacial acid such as carboxylic acids and anhydrides thereof including but not limited to propionic acid, butyric acid, and acetic acid under a temperature of from about 60° C. to about 150° C., and preferably from about 100° C. to about 120° C. and ambient pressure to form 2,2'-dihalo-5,5'dimethoxybiphenyl, and preferably 2,2'-dibromo-5,5'dimethoxybiphenyl. Acetic acid is preferred. The period of reaction may range from about 1 hour to about 10 hours, and preferably from about 2 hours to about 4 hours. The concentration of halogen in the acid-containing mixture is from about 5 to about 50%, and preferably from about 10 to about 20%, based upon the total weight of the halogen-acid mixture. The molar ratio of 3,3'-dimethoxybiphenyl to the halogen desired is about 1 to 2, preferably about 1 to 3, and most preferably about 1 to 2.2.

As illustrated in FIG. 1, the product of the initial halogen reaction, i.e., 2,2'-dibromo-5,5'dimethoxybiphenyl, is then halogenated into a second 2,2'-dihalo-5,5'-dimethoxybiphenyl, i.e. 2,2'-diiodo-5,5'-dimethoxybiphenyl, via a lithiation exchange reaction in the presence of an organolithium reagent, such as n-butyllithium, to form a dilithiated intermediate which is then reacted with the desired halogen, or via a Grignard reaction with magnesium to form a bis-Grignard intermediate, which is then reacted with the desired halogen. The lithiation-halogenation reactions occur at a temperature of from about −78° C. to about −20° C., and preferably from about −78° C. to about −50° C. and ambient pressure, while the Grignard-halogenation reactions occur under conditions of ambient temperature and pressure. Iodine is the preferred halogen. The molar ratio of the second 2,2'-dihalo-5,5'dimethoxybiphenyl to halogen is about 1:2, preferably about 1:3, and most preferably about 1:2.2. The molar ratio of the second 2,2'-dihalo-5,5'dimethoxybiphenyl to the organolithium reagent or magnesium is about 1:2, preferably about 1:3, and most preferably about 1:2.5. The period of these halogenation reactions may depend upon the specific chemical structure, but will generally be from about 0.5 hours to about 4 hours, and preferably from about 1 hour to about 2 hours.

The second 2,2'-dihalo-5,5'-dimethoxybiphenyl, and preferably 2,2'-diiodo-5,5'-dimethoxybiphenyl, is then demethylated under temperatures of about −78° C. to about −20° C., and preferably from about −78° C. to about −50° C., and ambient pressure, with a bromide-containing compound such as hydrogen bromide, boron tribromide, or mixtures thereof in a chlorinated solvent such as a chlorohydrocarbon including but not limited to dichloromethane to yield 2,2'-dihalo-5,5'-dihydroxybiphenyl, and preferably 2,2'-diiodo-5,5'-dihydroxybiphenyl. Boron tribromide is the preferred reactant. The concentration of the bromide-containing compound in the chlorinated solvent may range from 0.05M to about 1M, and preferably from about 0.1M to about 0.5M. The period of the demethylation reaction may depend upon the chemical structure, but will generally be from about 5 minutes to about 2 hours, and preferably from about 15 minutes to about 1 hour. The molar ratio of 2,2'-diiodo-5,5'dimethoxybiphenyl to the bromide-containing compound is about 1:3 to 1:10, and preferably about 1:2.5 to 1:5.

The product of the demethylation reaction, i.e. 2,2'-diiodo-5,5'-dihydroxybiphenyl, is then reacted with a compound containing a hydroxyl protective group, preferably dihydropyran, in the presence of a protection catalyst under temperature conditions ranging between 0° C. to about 30° C., and preferably from about 20° C. to about 25° C., and ambient pressures to form 2,2'-diiodo-5,5'-bis(tetrahydropyranoxy)biphenyl. Details of this reaction are well-known in the art and are described in, for example, Lindley which is incorporated herein by reference, with the exception that we have found that it is preferable to use from about 100% to about 500%, and more preferably from about 200% to about 250% by weight catalyst relative to 2,2'-dihalo-5,5'-dihydroxybiphenyl. Suitable protection catalysts have a purity of at least about 99% and include arylsulfonic acids such as p-toluenesulfonic acid, benzenesulfonic acid, and p-bromophenylsulfonic acid, with p-toluenesulfonic acid being preferred. The molar ratio of the hydroxyl-containing compound to 2,2'-diiodo-5,5'-dihydroxybiphenyl is from about 100:1 to 500:1, more preferably from about 200:1 to 250:1, and most preferably from 100:1 to 150:1. The period of the hydroxy reaction may depend upon the reactivity, but will generally be from about 1 hour to about 48 hours, and preferably from about 12 hours to about 24 hours.

The 2,2'-diiodo-5,5'-bis(tetrahydropyranoxy)biphenyl, and preferably 2,2'-diiodo-5,5'-bis(tetrahydropyranoxy) biphenyl, is then ethynylated with a solution of a copper acetylide compound in a solvent having a boiling point of from about 100° C. to about 120° C. to form 2,2'-bis(C≡CR')-5,5'-bis(tetrahydro-pyranoxy)biphenyl compounds, wherein R' is a moiety comprising an alkyl having from about 1 to about 20, and preferably from about 1 to about 6 carbon atoms; an alkenyl having from about 1 to about 20, and preferably from about 2 to about 10 carbon atoms; an aryl such as those having a substituted phenyl ring as illustrated by tolyl or anisyl, or those having a fused aromatic nucleus such as naphthalene, anthracene, phenanthrene, and pyrene; a heteroaryl such as furan, pyrrole, thiophene, pyridine, quinoline, quinoxaline, and derivatives and mixtures thereof, and preferably is a phenyl, a pentafluorophenyl, or a biphenylyl group, and most preferably a phenyl group. Suitable R' groups include, but are not limited to

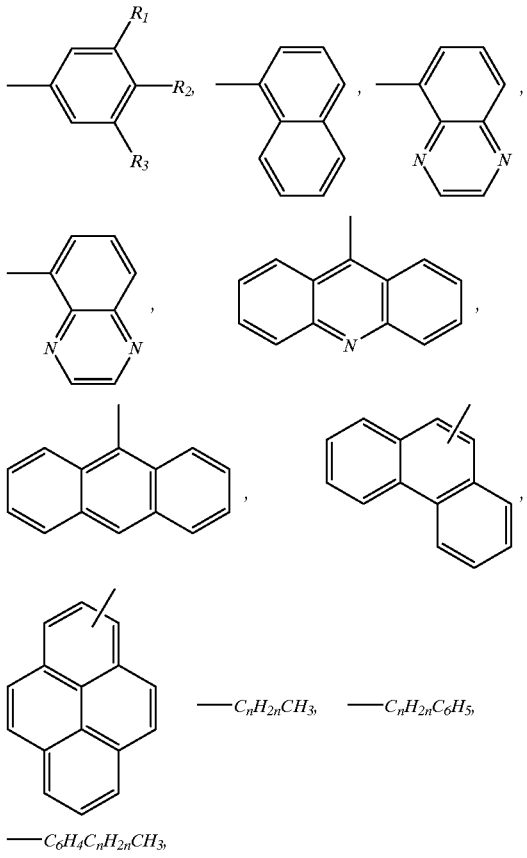

or mixtures thereof;

$R_1$, $R_2$, and $R_3$ are independently comprised of an alkyl having from about 1 to about 10 carbons, an aryl comprising phenyl, or biphenylyl, or terphenylyl, or mixtures thereof; and n is an integer of from about 0 to about 20, and preferably about 1 to about 5.

The temperature of the ethynylation reaction may range from about 80° C. to about 1 50° C., and preferably from about 90° C. to about 110° C. The pressure is ambient. The molar ratio of 2,2'-dihalo-5,5'-bis(tetrahydropyranoxy) biphenyl, i.e. 2,2'-dihalo-5,5'-bis(tetrahydropyranoxy) biphenyl, to copper acetylide compound is about 1 to 10, preferably about 1 to 5 and most preferably about 1 to 2.5. The period of the ethynylation reaction will depend upon reactivity of the haloaromatic, i.e. 2,2'-diiodo-5,5'-bis(tetrahydropyranoxy)biphenyl, but will generally be from about 30 minutes to about 48 hours, and preferably from about 4 hours to about 30 hours.

The copper[I] acetylide compound is of the formula wherein R' is as described above.

The preferred copper[I] acetylide compound is copper[I] phenylacetylide. Further details of the phenylethynylation of haloaromatics by copper[I] phenylacetylide is described in, for example, Stephens, R. D., et al, 28 J. Org. Chem. 3313–3315 (1963) and Castro, C. E., et al., 31 Journal of Organic Chemistry 4071–4078 (1966).

Examples of suitable solvents for the ethynylation reaction include pyridine and pyridines substituted with moieties such as alkyl having from about I to about 10, and preferably from about 1 to about 5 carbon atoms. Pyridine is preferred. The solvents have a purity of at least about 95% and a copper[I] acetylide concentration of from about 10% to about 40%, and preferably from about 10% to about 20%.

The tetrahydropyranyl groups are removed from 2,2'-bis(C≡CR')-5,5'-bis(tetrahydropyranoxy)biphenyl by acid hydrolysis under ambient conditions to form ethynylated aromatic compounds of the formula 2,2'-bis(C≡CR')-5,5'-dihydroxybiphenyl, wherein the substituent R' is as above-described. Suitable acid solutions contain, based upon the total weight of the solution, from about greater than 0% to about 20%, and preferably from about 5% to about 10% acid. Any acid may be used, but hydrochloric acid is preferred. Examples of suitable solvents include any aprotic solvent such as toluene. The molar ratio of the acid solution to 2,2'-bis(C≡CR')-5,5'-bis(tetrahydropyranoxy)biphenyl is from about 80:20 to 50:50, and preferably from about 80:20 to 75:25. The period of the hydrolysis reaction generally will be from about 1 hour to about 10 hours, and preferably from about 1 hour to about 3 hours.

Figure 2:
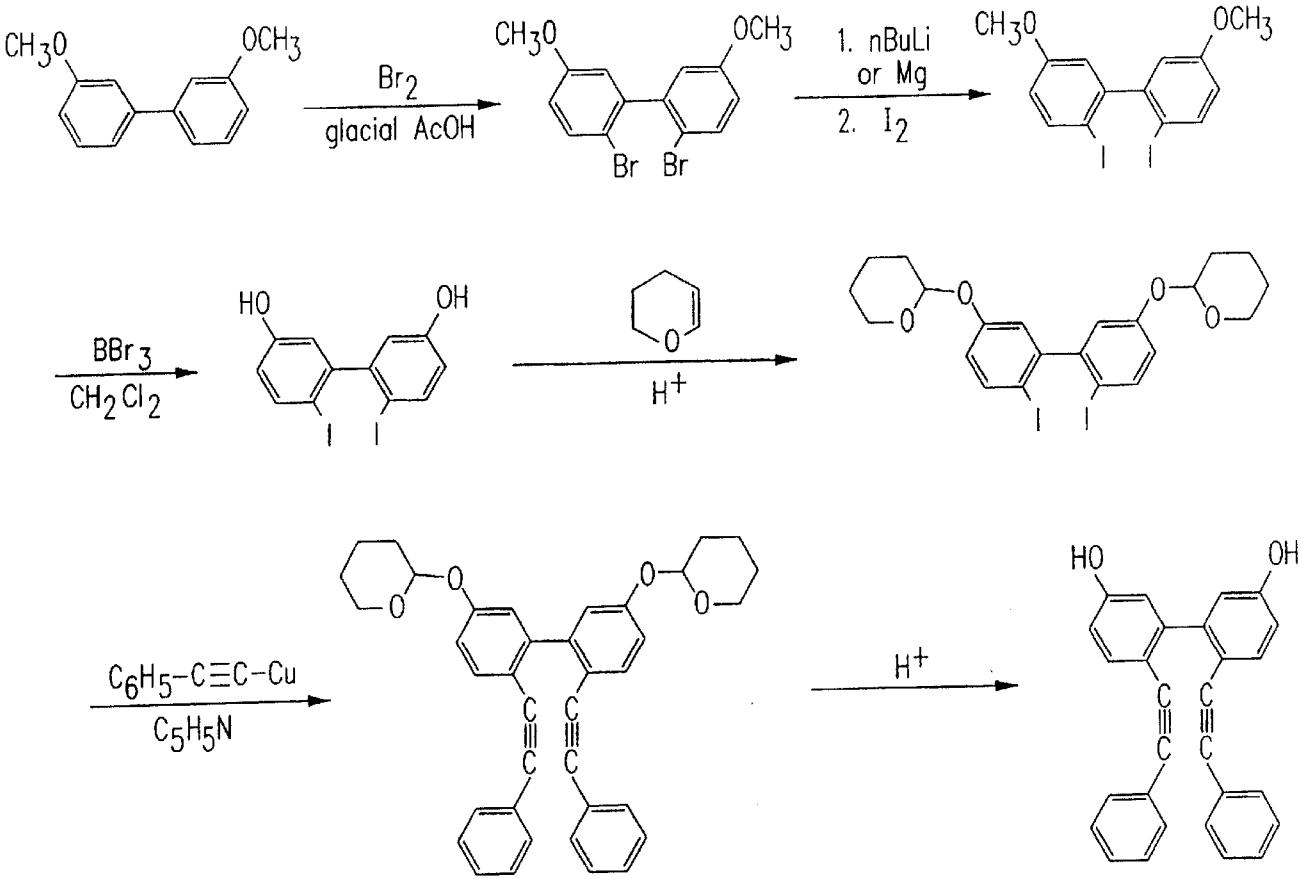
FIG. 2 illustrates a method for synthesizing 2,2'-Bis(phenylethynyl)-5,5'-dihydroxybiphenyl.

Examples of ethnylated aromatic compounds produced according to the process of the present invention include those 2,2-bis(substituted ethynyl)-5,5'-bis(tetrahydropryanoxy)biphenyl compounds of the formula:

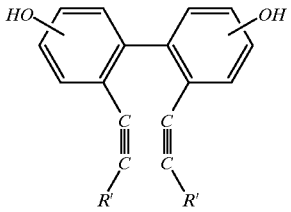

wherein R' is as above described. The preferred ethynylated aromatic compound is 2,2'-bis(phenylethynyl)-5,5'-dihydroxybiphenyl. FIG. 2 illustrates the preferred synthetic sequence for the synthesis of the preferred monomer, 2,2'-bis(phenylethynyl)-5,5'-dihydroxybiphenyl.

Preferably, the products of each above-described reaction step are recovered from any products, solvent and catalyst that may be present prior to commencement of the next reaction step. Preferably the products should be about 85–100%, and more preferably about 95–99% pure. The products may be recovered by any means well known in the art including but not limited to distillation, reprecipitation, extraction, and recrystallization.

The other starting material for producing the poly(arylene ethers) of the present invention includes the perfluorinated phenylenes of Formula A:

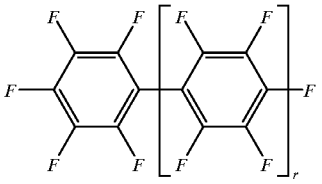

wherein r is an integer of from about 0 to about 50, preferably from about 0 to 10, and more preferably from about 0 to about 3;

or compounds of Formula D:

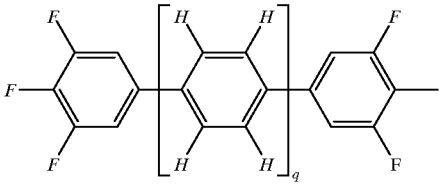

wherein q is an integer of from about 0 to about 49, preferably from about 0 to about 9, and more preferably from about 0 to about 3.

Compounds corresponding to both Formulas A and D can be readily synthesized by one of ordinary skill in the art without undue experimentation.

Examples of suitable perfluorinated phenylenes include hexafluorobenzene (m=0); decafluorobiphenyl (m=1); the three terphenyl structures (m=2), i.e., tetradecafluoro-para-terphenyl, tetradecafluoro-meta-terphenyl, and tetradecafluoro-ortho-terphenyl; and tetraphenyl structures (m=3) such as octadecafluoro-para, para, para-tetraphenyl and octadecafluoro-para, para, meta-tetraphenyl, octadecafluoro-para, para, ortho-tetraphenyl, and all isomers thereof due to ring catenation, and mixtures and copolymers thereof. Decafluorobiphenyl is preferred.

In another embodiment of the present invention, the fluorinated poly(arylene ethers) of Formula C may be synthesized by reacting the starting materials, i.e. the bisphenols of Formula B and the fluorinated phenylene compounds of Formulas A or D, under conditions sufficient to affect the polymerization reaction. More specifically, the bisphenol moieties of Formula A or D are replaced with, for example, bis(phenylethynyl) biphenyl moieties such as the 2,2'-bis(phenylethynyl)-4,4'-dihydroxybiphenyl or 2,2'-bis(phenylethynyl)-5,5'-dihydroxybiphenyl of Formula B, to form a polymer corresponding to Formula C having a glass transition temperature greater than about 350° C.:

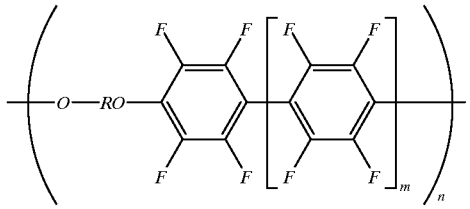

wherein

R is an aromatic nucleus which imparts a glass transition temperature of greater than 260° C. to the composition;

m is an integer of from about 0 to about 50, and preferably from about I to about 25, and more preferably from about 1 to about 10; and
n is an integer of from about 1 to about 200, and preferably from about 1 to about 100 and more preferably from about 25 to about 100.
Examples of suitable R groups include
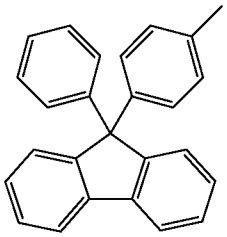
;
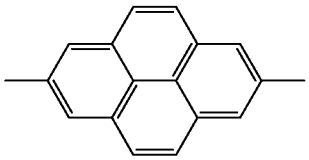
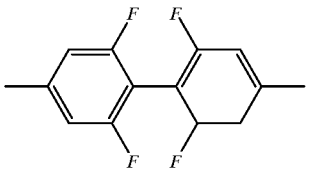
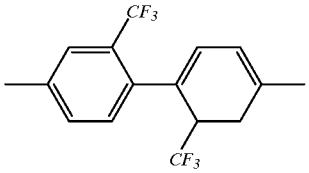
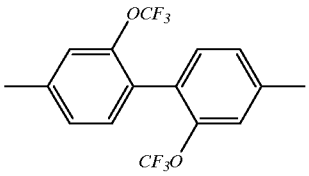
;
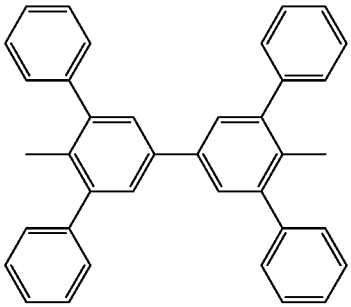
;
-continued
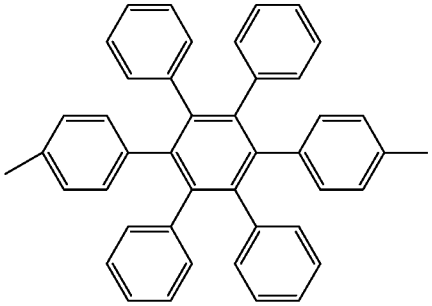
;
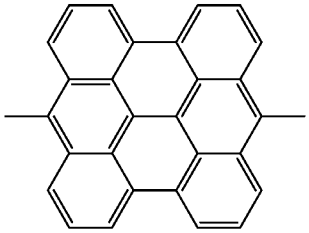
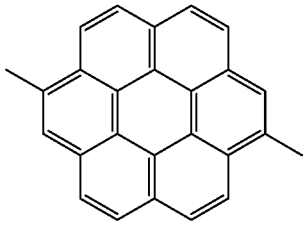
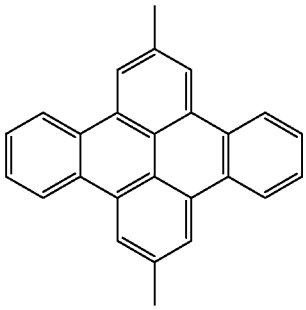
;
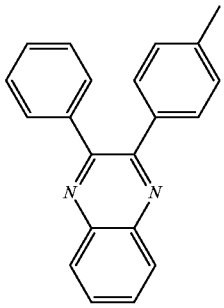

-continued

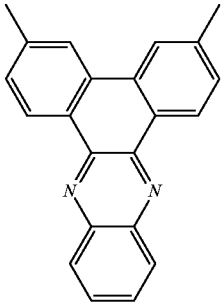

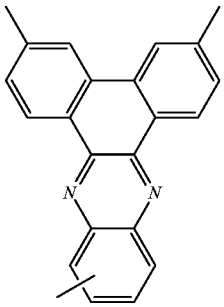

;

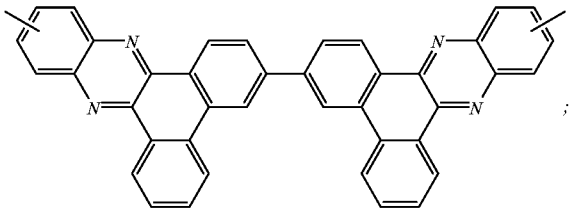

;

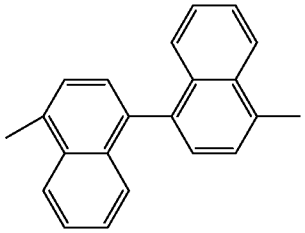

;

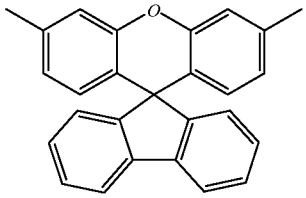

;

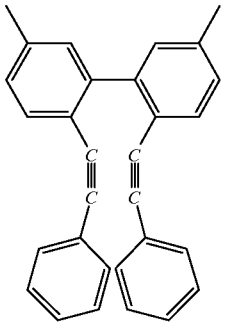

-continued

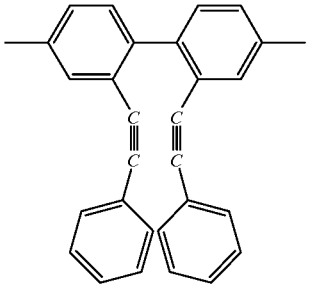

;

or mixtures thereof.

Preferred bisphenol compounds include

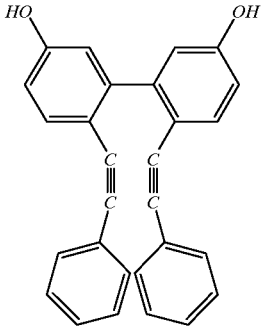

and 2,2'-bis(phenylethynyl)-5,5'-dihydroxybiphenyl

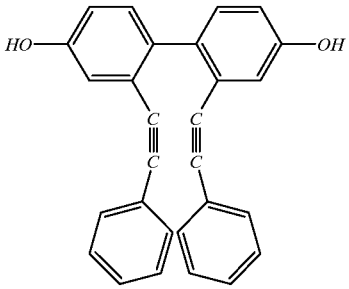

2,2'-bis(phenylethynyl)-4,4'-dihydroxybiphenyl, with 2,2'-bis(phenylethynyl)-5,5'- dihydroxybiphenyl being most preferred.

The temperature at which the polymerization reaction is conducted and the reaction time will depend on the molecular weight build-up desired in the compound having Formula C. One of ordinary skill in the art can readily optimize the conditions of the reaction to get the claimed results, but the temperature will generally be in the range of from about 100° C. to about 175° C., and preferably from about 110° C. to about 130° C., for a period of, for example, from about 12 to about 48 hours, and preferably from about 24 to about 30 hours. Pressure is not critical.

The molar ratio of compounds having Formula A or D to those having Formula B is about 1 to 1, preferably about 1 to 0.90, and most preferably from about 1 to 0.95.

Compounds corresponding to Formula C have a number-average molecular weight ("Mn") of from about 8,000 g/Mol to about 30,000 g/Mol, and preferably from about 10,000 g/Mol to about 20,000 g/Mol, and are produced in a yield of at least from about 50% to about 100%, and preferably from about at least 75% to about 90%, based upon the weight of monomers corresponding to Formula A, D, or B consumed.

The compounds corresponding to Formula C are preferably recovered from any inorganic by-products produced in the synthesis reaction via conventional isolation methods known in the art such as precipitation, extraction, washing with a non-solvent and drying, and combinations thereof.

In an alternative embodiment, copolymers corresponding to formula C"

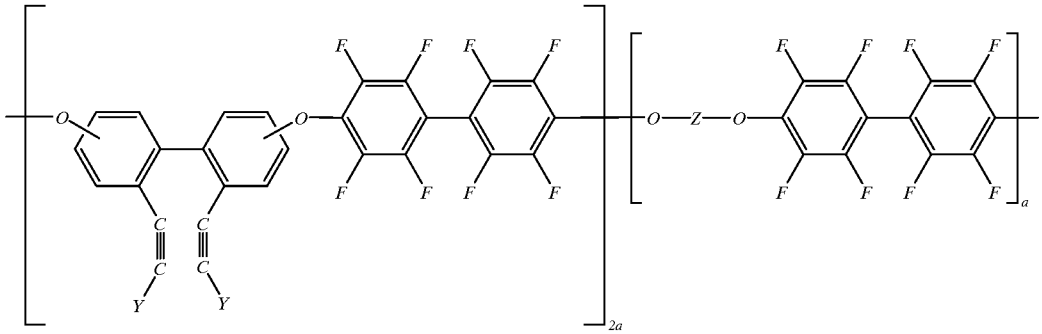

wherein

Z is any of the above-described aromatic nuclei in the compounds having Formula B or 1,5-naphthalenediyl, and preferably is 1,5-napthalenediyl;

Y is independently

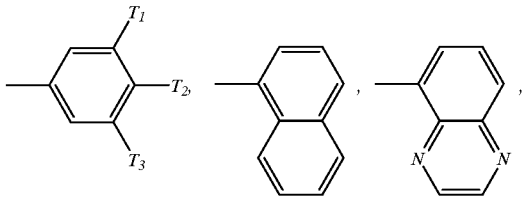

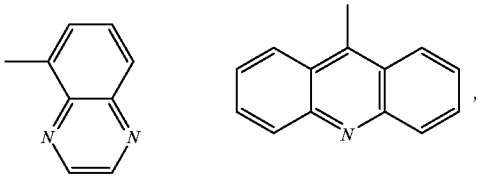

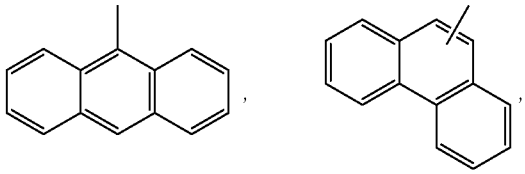

-continued

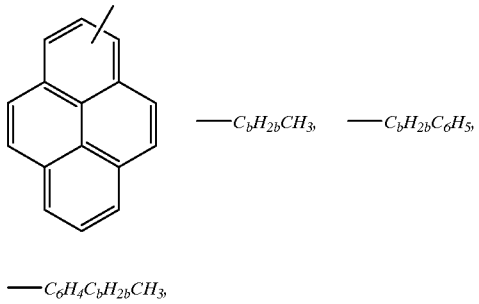

$T_1$, $T_2$, and $T_3$ are independently comprised of an alkyl having from about 1 to about 10 carbons, an aryl comprising phenyl, or biphenylyl, or terphenylyl, or mixtures thereof; and preferably is phenyl, a is independently an integer of from about 0 to about 200, preferably from about 10 to about 100, and more preferably from about 10 to about 50; and b is an integer of from about 0 to about 20, and preferably about 1 to about 5, may be produced by reacting compounds corresponding to Formula A with a compound corresponding to Formula B, an optional but preferred inorganic base such as potassium carbonate, sodium carbonate, potassium hydroxide, sodium hydroxide or mixtures thereof, and another bisphenol-containing coreactant corresponding to Formula Z under conditions set forth in the above polymerization reaction. The preferred inorganic base is potassium carbonate. The molar ratio of compounds containing Formula B to those coreactant compounds having Formula Z is about 20:1, and preferably about 5:1, and more preferably from about 2:1. A preferred compound of Formula C" is the copolymer corresponding to Formula C':

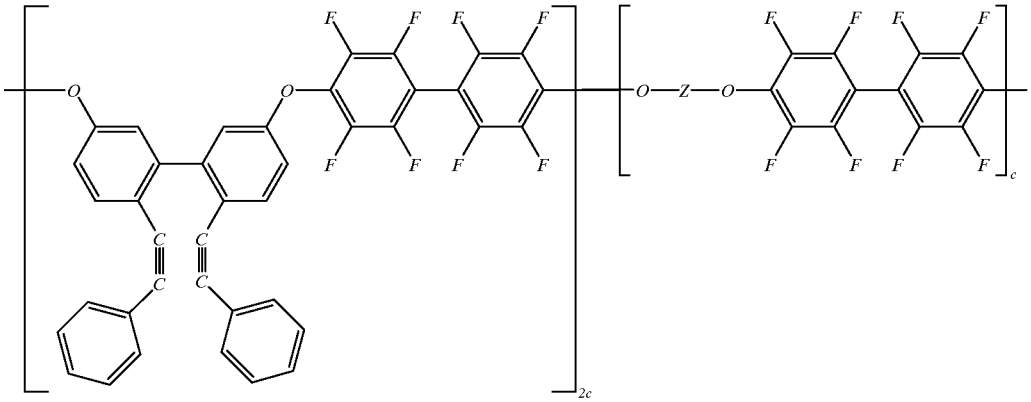

wherein c is independently an integer from about I to about 200, preferably from about 10 to about 100, and more preferably from about 10 to about 50;

Z is defined above for Formula C";

and the Y group of the compound having Formula C" is a phenyl.

In an alternative embodiment, a copolymer corresponding to Formula D":

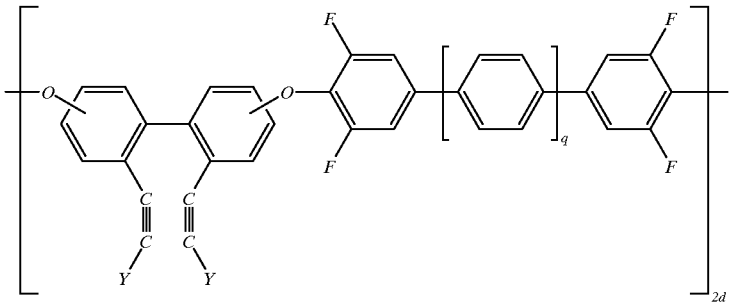

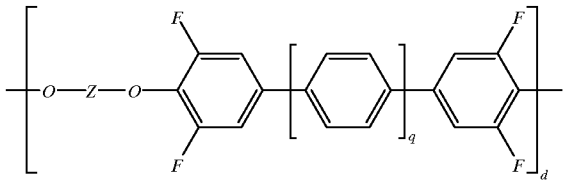

wherein

Z is any of the above-described aromatic nuclei in the compounds having Formula B or 1,5-naphthalenediyl, or mixtures thereof, and preferably is 1,5-napthalenediyl;

Y is independently

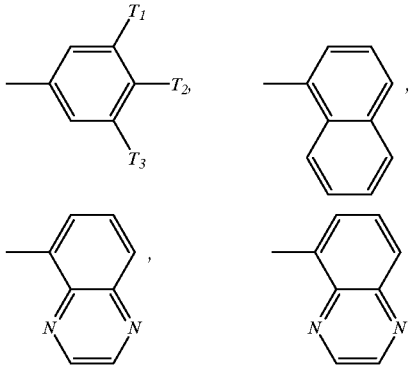

-continued

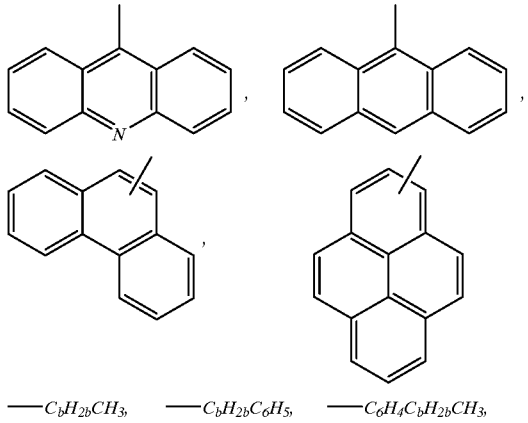

—$C_bH_{2b}CH_3$, —$C_bH_{2b}C_6H_5$, —$C_6H_4C_bH_{2b}CH_3$, and preferably is phenyl, $T_1$, $T_2$, and $T_3$ are independently comprised of an alkyl having from about 1 to about 10 carbons, an aryl comprising phenyl, or biphenylyl, or terphenylyl, or mixtures thereof; and preferably is phenyl, d is independently an integer of from about 1 to about 200, preferably from about 10 to about 100, and more preferably from about 10 to about 50;

b is an integer of from about 0 to about 20, and preferably about 1 to about 5, and q is independently an integer of from about 0 to about 50, preferably from about 0 to 20, and more preferably from about 0 to about 3 may be produced by reacting compounds corresponding to Formula D with a compound corresponding to Formula B, an optional but preferred inorganic base as described above, and another bisphenol-containing coreactant corresponding to Formula Z under conditions set forth in the above polymerization reaction for compounds having formula C. The preferred inorganic base is potassium carbonate.

The fluorinated poly(arylene ether) composition of the present invention may be formed into a solution suitable for application onto the substrate by any conventional means, such as spin-coating. Preferably, the solution is centrally applied to the substrate, which is then spun at speeds ranging between about 500 and about 6000 rpm, preferably between about 1500 and about 4000 rpm, and most preferably at 2900 rpm to 3,100 rpm, for about 2 to about 60 seconds, and preferably from about 5 to about 30 seconds, in order to spread the solution evenly across the substrate surface.

Solvents suitable for use in the solutions of the present invention include aprotic solvents such as cyclopentanone; cyclic ketones such as cyclohexanone, cycloheptanone, and cyclooctanone; cyclic amides such as N-alkylpyrrolidinone wherein the alkyl has form about 1 to about 4 carbons atoms and N-cyclohexylpyrrolidinone and mixtures thereof. Cyclopentanone is preferred.

The solution is formed by combining the solvent and poly(arylene ether) composition under ambient conditions in any conventional apparatus having, a non-metallic lining, and preferably in a glass-lined apparatus to produce a solution comprised of, based upon the total weight of the solution, from about 1 to about 50%, and preferably from about 3% to about 20% of the fluorinated poly(arylene ether) composition and from about 50% to about 99%, and preferably from about 80% to about 97% of solvent.

The resulting mixed solution is then filtered under ambient conditions via filtration means well-known in the art including, but not limited to commercially available filtration cartridges having the desired porosity. Preferably, these filtration cartridges consist of a non-stick, scratch resistant material such as Teflon® available from DuPont. Although one skilled in the art can readily determine without undue experimentation to the ultimate pore size of the filtration means based upon the desired application, it is generally preferable to use a means having a pore size less than 1.0 $\mu$m, and preferably less than 0.1 $\mu$m.

In a preferred embodiment, the mixed solution is filtered through a variety of filtration means having different pore sizes. More preferably, the solution is filtered sequentially through about 4 filtration means having a pore size of about 1.0 $\mu$m, about 0.5 $\mu$m, about 0.2 $\mu$m, and about 0.1 $\mu$m, respectively.

Typically the solutions of this invention are applied by standard spin-coating techniques well-known in the art onto wafer substrates, such as silicon or metal wafers having an aluminum wiring circuit pattern on their surface, to be processed into integrated circuits and/or other microelectronic devices.

The coated substrate is then heated by any conventional means known in the art. Preferably, the combination is heated by placing it on top of a hot plate. Typically this is done commercially via a conventional integrated spin-coater/hot plate system. This type of heating not only rapidly and directly expels the solvent from the solution and causes the film to flow, but is also easily adaptable for continuous processing operations. The coated substrate is typically heated for about 30 seconds to about 5.0 minutes at temperatures ranging between about 50° C. and about 250° C., and more preferably about 100C and about 200° C. Multiple hot plates, i.e. between about 2 and about 5, and preferably from about 2 to about 3, can be used to process the coated substrates under similar conditions.

In a preferred embodiment, the coated substrate is baked for up to about 2 minutes, and preferably from about 50 to about 70 seconds, on a hot plate set at a temperature of about 70° C. to about 150° C., and preferably from about 100° C. to about 150° C., then cured with thermal or electron beam energy in a conventional curing means such as an oven chamber or an autoclave, within a temperature range of about 300° C. to about 450° C., and preferably from about 375° C. to about 425° C., for about 0.5 to about 4 hours, and preferably from about 1.0 to about 2.0 hours. The cure pressure may range between about 1 torr to about 2 torr. The length of exposure will generally range from about 2 to about 45 minutes, and preferably from about 5 to about 25 minutes for a dose of electron beam energy ranging from about 1000 to about 50,000, and preferably from about 2500 to about 10,000 $\mu C/cm^2$. The accelerating voltage of the electron beam may vary from about I to about 25 KeV. Further details regarding such curing methods may be found in U.S. Serial No. 60,000,239 filed on Jun. 15, 1995 (pending) and U.S. Pat. No. 5,003,178 to Livesay, et al, which is incorporated by reference. Depending on the processing characteristics of the polymer, the baked, uncured coated substrate may be then baked a second time or third time for up to about 2 minutes/baking, and preferably from about 50 to about 70 seconds/baking, on a hot plate set at a temperature of about 90° C. to about 200° C., and preferably from about 130° C. to about 150° C., prior to being cured with thermal or electron beam energy under the time and temperature conditions set forth above.

The thickness of the resulting thin-film ranges from about 0.5 $\mu$m to about 40 $\mu$m, preferably from about 0.8 $\mu$m to about 2.0 $\mu$m. The films produced by this invention generally exhibit a thickness standard deviation less than 2%, and preferably less than 1%, of the average film thickness.

The films produced according to the present invention possess several beneficial properties such as a Tg of greater than about 350° C. and a dielectric constant below about 2.8. Although not wishing to be bound by any theory, we believe that the high Tg is a result of the intramolecular cyclization ("IMC") reaction of the two proximal phenylethynyl pendent groups in bisphenol compounds such as 2,2'-bis (phenylethynyl)-5,5'-dihydroxybiphenyl. The film is uniform and can be produced with a high degree of consistency. The film is resistant to organic solvents, and has minimal loss in mechanical strength and modulus above its Tg to less than 1.5 orders of magnitude.

The following nonlimiting measurements illustrate the properties of the poly(arylene ether) solutions and thin films of the present invention. It can be seen that the film possesses superior thermomechanical and electrical properties:

1) Film Thickness (Å)

Using a calibrated Nanospec® AFT-Y CTS-102 model 010-180 reflectometer Film Thickness Measurement System available from Nanometrics, Co., light of wavelengths from about 480 nm to 790 nm locally illuminates a coated sample. The reflected light is detected and converted to a film thickness in Angstroms (Å) via its internal numerical algorithm. Measurements are acquired for five different locations on the wafer. The average of these five values is recorded.

2) Film Stress (MPa)

A coated wafer is placed inside the furnace chamber of a Flexus™ model 2410 Film Stress Measurement System available from Tencor Instruments. After inputting the value of a films' thickness into the System, the film's stress is computed therefrom.

3) Molecular Weight ("MW")

About 50 $\mu$l of a 0.5% solution of the subject poly(arylene ether) in N-methylpyrrolieinone ("NMP") is injected into a gel phase chromatography system ("GPC") from Waters. This GPC system has B columns containing gels with an average cavity size of 10$\mu$, which are available from Polymer Labs. A continuous flow of 0.0125 M solution of LiBr in NMP is maintained. The GPC is calibrated using polystyrene standards available from Polymer Labs under the tradename "PS-2". These standards have a MW ranging from 580 g/Mol to 400,000 g/Mol. Further details of this procedure are set forth in Rosen, S., "Fundamental Principles of Polymeric Materials 53–81 (2nd Ed. 1993).

4) Dielectric Constant

The dielectric constant of a poly(arylene ether) film is determined using the capacitance-voltage ("CV") measurement technique. Metal-oxide semiconductor ("MOS") capacitors are constructed by depositing the polymer film onto a thermally grown silicon dioxide layer on a low-resistivity n-type silicon wafer. The silicon wafer acts as the bottom electrode of the capacitor structure. The top electrode (gate electrode) is formed by sputter deposition through a shadow mask of 1 $\mu$m of Al onto the polymer film. Owing to the fact that the radius of the Al dot is much greater than the combined polymer film and thermal oxide thicknesses, the parallel plate approximation is used to determine the dielectric constant of the polymer film. The following formula is valid for the parallel plate geometry used:

$$k_F = \frac{d}{k_o A}\left[\frac{C_{ox}C}{C_{ox} - C}\right]$$

where

C is the measured total capacitance of the film $C_{ox}$ is the capacitance due to the oxide film ($C_{ox}=k_O.k_{ox}.A/d_{ox}$)

$k_O$ is the permittivity of the free space ($8.854\times10^{-14}$ F/cm)

$k_{ox}$ is known as 4.0

$k_F$ is the dielectric constant

A is the measured area of the deposited Al dot (electrode)

d is the measured thickness of the polymer film $d_{ox}$ is the known thickness of the thermal oxide layer The value of C, the total measured capacitance, is determined with the MOS capacitor biased into the accumulation mode, which occurs when a positive gate potential is applied. The capacitance is measured using a Hewlett-Packard Model 4061A semiconductor measurement system consisting primarily of a sensitive multifrequency (10 KHz–10 MHz) Induction Capacitance and Resistance ("LCR") meter, current and voltage sources, ramp generator, and picoammeter. All measurements are made at a frequency of 1 Mhz. Prior to a set of measurements, the stray capacitance due to the coaxial cable and probe unit is zeroed out.

Further details of this procedure are set forth in "SOG Dielectric Constant Theory", report by AlliedSignal Inc., Advanced Microelectronic Materials Division (Jan. 3, 1995). Additional details for dielectric constant measurements are set forth in Solymar, L. et. al., "Lectures on the Electrical Properties of Materials," (2nd Ed. 1979).

The metal-insulator-metal ("MIM") structure used in the electrical measurements can be a direct-on-metal ("DOM") structure (i.e., Al/polymer/Al) or with a capping layer (liner) in the total MIM structure (i.e., Al/Polymer/Cr/Cu/Cr/Al). The DOM structure comprises an underlayer of aluminum onto which a layer of poly(arylene ether) film has been deposited by standard spin-coating technique and cured at 425° C. for 1 hour. A layer of Al dots is then deposited by standard plasma vapor deposition ("PVD") through a shadow mask. The thickness of each layer ranges from about 0.5 to about 1 $\mu$m. The test structure incorporating the capping layer is comprised of a thin multilayer metal liner applied directly over the aluminum underlayer, before the deposition of the poly(arylene ether). The capping liner, which is comprised of two outer layers of chromium with a copper layer therebetween, has a total thickness of about 200 Å to about 300 Å. Details of this test procedure are set forth in Lau, K. S. Y., et al, "Characterization and Thin-Film Properties of FLARE™, A Low Dielectric Constant, High Tg Fluorinated Poly(arylene ether), as an Intermetal Dielectric for Interconnect Applications," Proceedings of Low Dielectric Constant Materials and Interconnects Workshop (California Apr. 30–May 1, 1996).

Alternatively, from measurements of the out-of-plane refractive index, $n_{TM}$, the out-of-plane dielectric constant was also calculated from the Maxwell identity, $K=n_{TM}^2$. Similarly, from measurements of the in-plane refractive index, $n_{TE}$, the in-plane dielectric constant was calculated from the Maxwell identity, $K=n_{TE}^2$. The Maxwell identity expressed in this form assumes that the film is nonmagnetic, which is the case. Details of this study are set forth in McKerrow, A. J., et al. "Characterization of Low k Dielectrics for ILD Applications," Proceedings of Low Dielectric Constant Materials and Interconnects Workshop (California Apr. 30–May 1, 1996) [hereinafter "McKerrow"].

5) Differential Scanning Calorimetry ("DSC")

About 5 mg of poly(arylene ether) powder was heated at a rate of 10° C./min in a purged nitrogen environment in a Perkin-Elmer Model DSC 7 system from a temperature of 25° C. to 450° C. The film was maintained therein at a temperature of 450° C. for 5 minutes before cooling at a rate of 10° C./min to 25° C. The Tg was calculated from a deflection in the temperature (°C.) versus heat flow (Watt/g) curve as known in the art.

6) Dynamic Mechanical Analysis ("DMA")

Measures storage modulus (MPa) and loss modulus (MPa); 1 cm×5 cm×1 mm samples are placed into a Dynamic Mechanical Spectrometer 110 available from Seiko Instruments Inc., U.S.A. set in the Flexural Mode (3 point bending mode) with a frequency of 1 Hz; the samples are heated at a rate of 3° C./minute from −20° C. to 300° C. The Tg is determined by the position of the tan δ peak (=storage modulus/loss modulus).

7) Thermal Mechanical Analysis ("TMA")

Measures Tg; Film disks having a 10 mm diameter and a 30 μm to 40 μm thickness are placed into a Perkin-Elmer Thermal Mechanical Analyzer. As the temperature therein is increased at a rate of 10° C./min from −50° C. to 300° C., a continuous force of about 2 mN to about 3 mN is applied to the film in extension.

The coefficient of thermal expansion ("CTE") is derived from the slope of the graph of the film dimension increase (ppm) versus temperature (°C.) as recorded by the Analyzer. The Tg is obtained from the deflection in the curve of the graph as is known in the art.

The CTE was also derived via the "bending beam" procedure, details of which are set forth in "McKerrow".

8) Gapfill Ability (μm)

After coating a patterned wafer with the subject poly (arylene ether) and curing, the resulting 6 inch diameter wafer with a cured film layer of 1 micron thickness thereon was cleaved via conventional or focused ion beam milling procedures. The cross-sectional view of the coated wafer was examined under a JEOL Model JSM6300F scanning electron microscope ("SEM") in order to determine what gap sizes and trench depths on the wafer were completely filled. The reported values represent the smallest gap sizes which could be completely filled without defects.

9) Solution Viscosity (cP)

Approximately 20 ml of a poly(arylene ether) solution were placed in a Brookfield Synchro-lectric viscometer, Model LVT 62238 to measure the solution viscosity, typically at ambient temperature.

10) Film Thickness Uniformity (%)

The thickness as determined by a DekTek profilometer or by ellipsometry of the film at 20 various locations was averaged. The reported value is the percent of nonuniformity of the coated wafer.

11) Refractive Index—Out of Plane and In Plane, ("$n_{TE}$") and ("$n_{TM}$"), Respectively Details of this test procedure are set forth in "McKerrow.".

12) Residual Stress (MPa)

After measuring the residual stress of a coated, cured poly(arylene ether) film-coated wafer in the above-described Tencor System, the wafer was heated to a temperature of 400° C. or 450° C. over a time period of 60 min in the System simultaneously with the recording of a stress measurement of the film at minute intervals. The temperature of the System was then decreased to 25° C. over a time period of 60 minutes simultaneously with the recording of a stress measurement of the film at minute intervals. The temperature in the System was then held constant at 25° C. for 6 hours simultaneously with the recording of a stress measurement of the film at 6 minute intervals. This cycle was repeated 4 additional times.

The reported Residual Stress values are recorded after the completion of five cycles. The Tg was determined from the temperature at which the film exhibited zero stress.

The Residual Stress of a similar poly(arylene ether) thin film was also measured via the "bending beam" procedure as set forth in "McKerrow.".

13) Thermal Stability

Both the isothermal thermal graphometric analysis ("ITGA")(microgram loss/time) and thickness change (%) were determined according to the procedure set forth in Lau, K S. Y., et al, "Characterization and Thin-Film Properties of FLARE™, A Low Dielectric Constant, High Tg Fluorinated Poly(arylene ether), as an Intermetal Dielectric for Interconnect Applications," Proceedings, Thirteenth International VLSI Multilevel Interconnection (VMIC) Conference & Poster Session (California Jun. 18–20, 1996) [hereafter "Layu"].

EXAMPLES

Example 1

Preparation of Coating Solution

After preparing a 12% solution of a poly(arylene ether) corresponding to formula C' wherein Z is 1,5-naphthalenediyl and n is about 10, available from Allied-Signal under the tradename "FLARE™ 1.51", by dissolving the appropriate quantity of the solid polymer in cyclopentanone under ambient conditions in a glass lined reactor, the solution was filtered through a series of four Teflon filtration cartridges at different pore sizes, i.e. 1.0, 0.5, 0.2 and 0.1 micrometers.

Example 2

Preparation of Film Coated Substrate

About 3 ml to about 7 ml of the solution prepared in Example I was processed onto the surface of a silicon wafer having a diameter of 6 inches, using a spin coater manufactured by Silicon Valley Group, Inc. (SVG), Model No. 8826, and a multiple hot plate oven track manufactured by SVG, Model 8840, with the initial spin conditions set at 72° F., 20–30 mmHg, and a spin cup humidity of 40%. The spin-bake-cure recipe was in accordance with the conditions set forth in "Lau".

Various thermomechanical and electrical properties of the film were measured as illustrated below in Table 1.

TABLE 1

PROPERTIES OF FLARE ™ 1.51 POLYARYLENE ETHER FILM

| PROPERTY | Poly(arylene ether) FLARE ™ 1.51 |
|---|---|
| Cured film thickness | Nominally 1 micron |
| Film Thickness Uniformity | <2% |
| Refractive Index (out-of-plane, $D_{TM}$) | 1.62 |
| Refractive Index (in-plane, $D_{TE}$) | 1.63 |
| Dielectric Constant (out-of-plane) calculated from Maxwell identity $k = D_{TM}^{2:}$ | 2.62 |
| Dielectric Constant (in-plane) calculated from Maxwell identity $k = D_{TE}^{2:}$ | 2.63 |

TABLE 1-continued

| PROPERTIES OF FLARE ™ 1.51 POLYARYLENE ETHER FILM | |
|---|---|
| PROPERTY | Poly(arylene ether) FLARE ™ 1.51 |
| Dielectric Constant (out-of-plane) | |
| MIM (caped plate) and 1 MHz | 2.52 |
| MIM (DOM) and 1 MHz | 2.84 |
| Glass Transition Temperature | >350° C. (DMA)<br>378° C. (TMA) |
| Residual Stress (stress hysteresis) MPa | 31–37 |
| Residual Stress (Bending Beam) MPa | 45 |
| CTE (ppm/° C.) (TMA) | 43–52 |
| CTE (ppm/° C.) (Bending Beam) | 40 |
| Thermal Stability<br>1) ITGA weight loss (% in 2 hr)<br>2) thickness change (%) | 1) 1–2% (400° C.)<br>3–5% (425° C.)<br>5–6% (450° C.)<br>2) zero change |
| Gapfill Ability (type of substrate surface) | 0.30 $\mu$m ($SiO_2$)<br>0.25 $\mu$m (Al) |

Figure 4A:
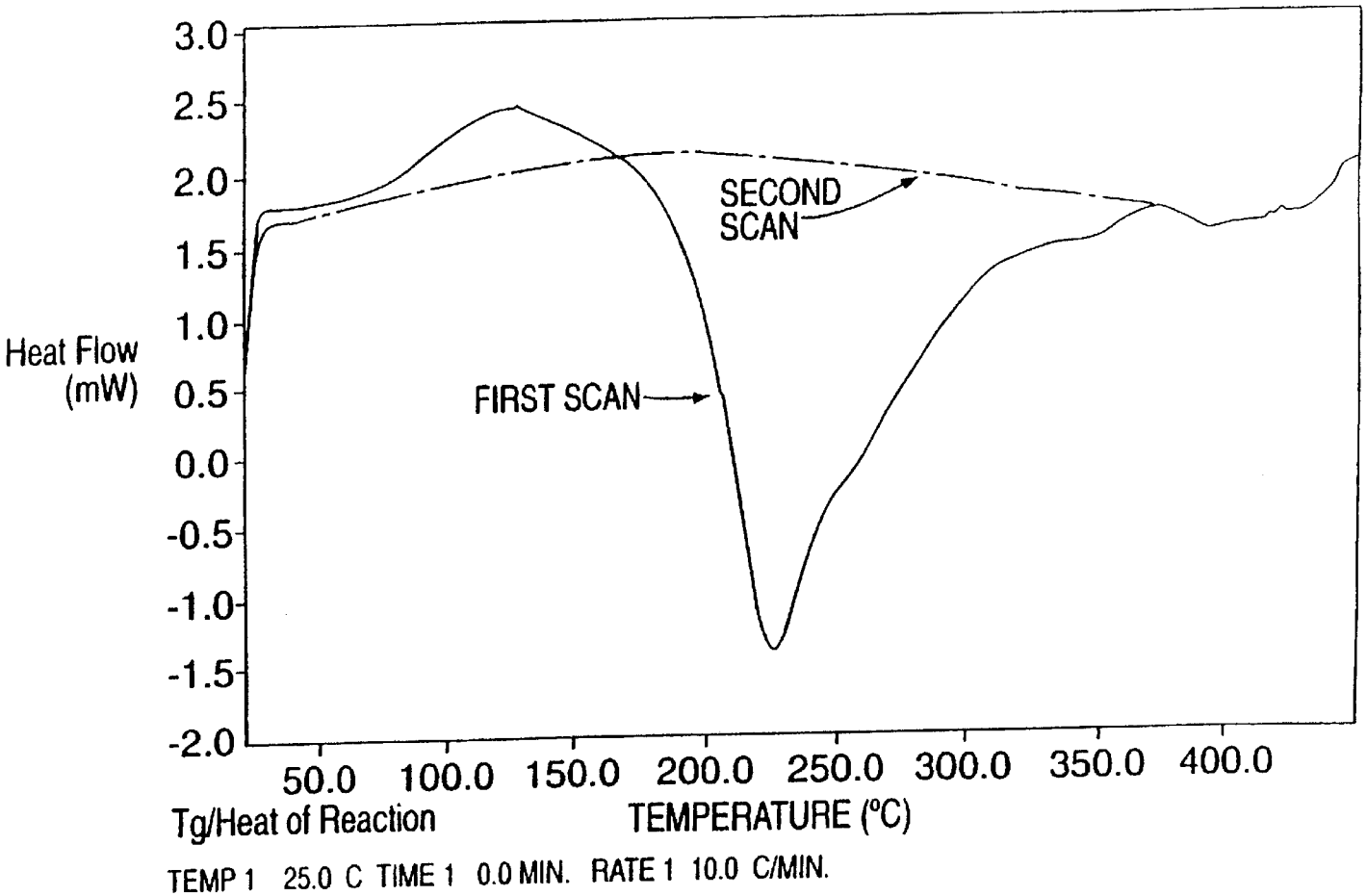
FIG. 4a illustrates the thermal behavior of a poly(arylene ether) composition containing 2,2'-bis(phenylethynyl) biphenyl-5,5'-dioxy linkages during two thermal cycles under conditions of differential scanning calorimetry ("DSC").
Figure 4B:
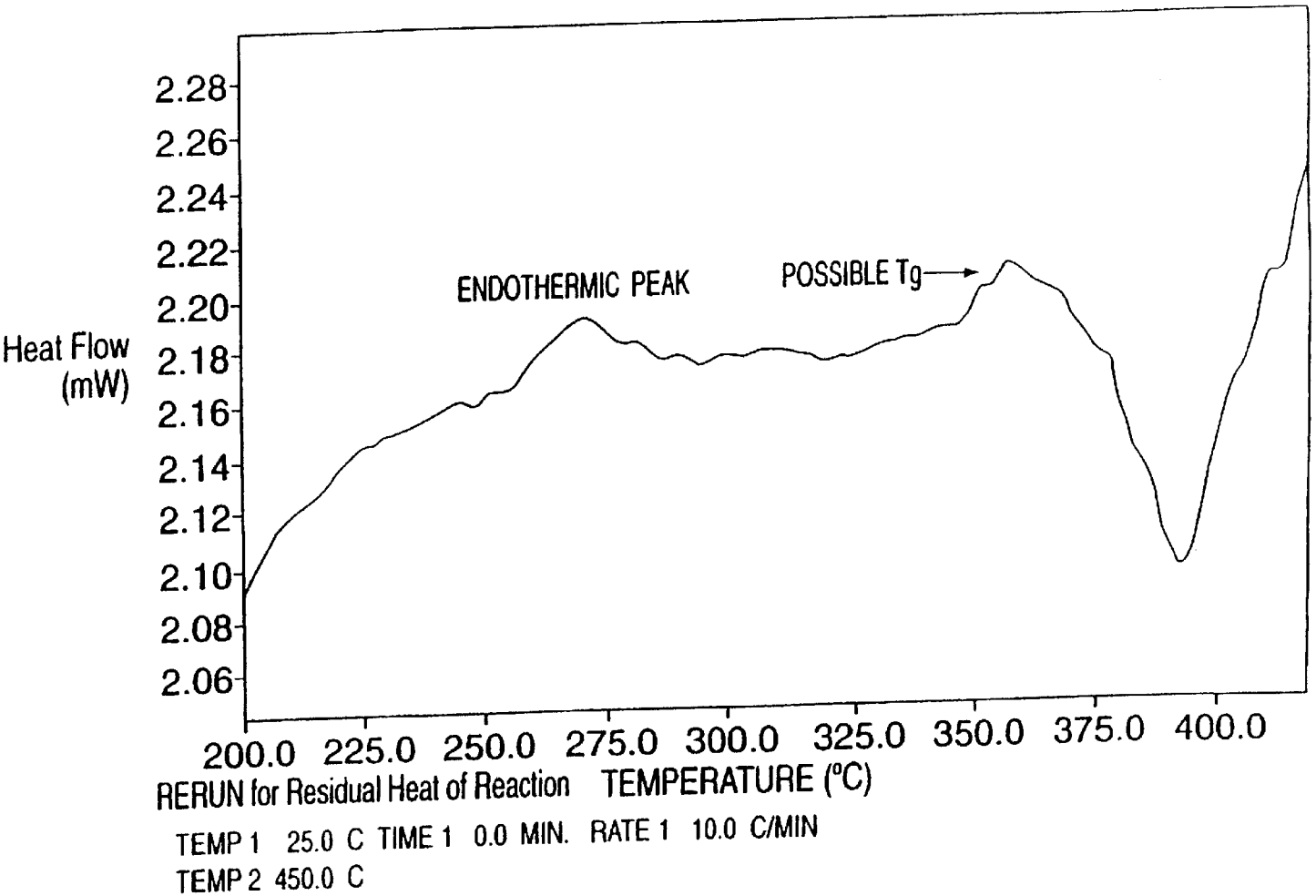
Figure 5:
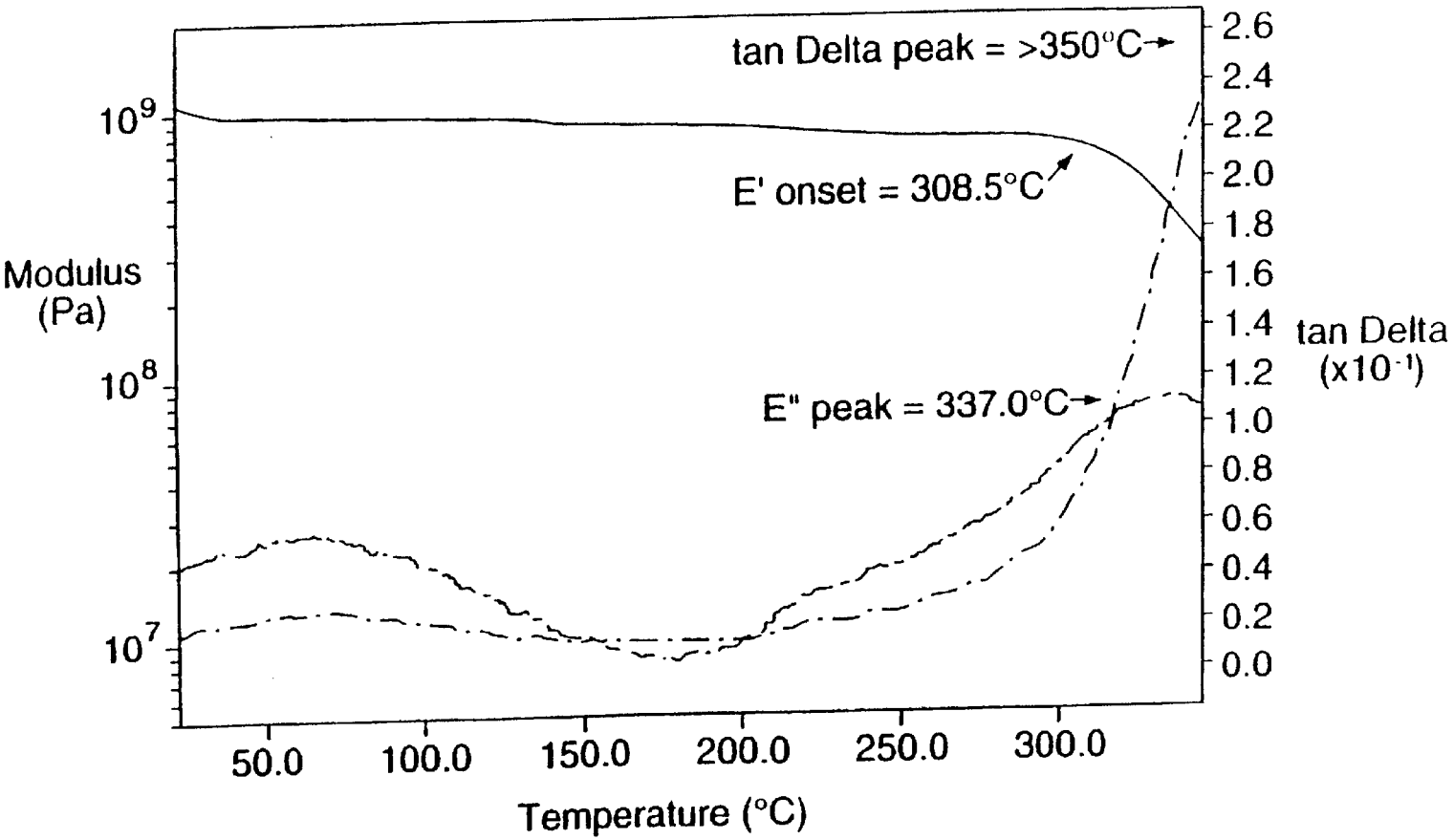
FIG. 5 illustrates the thermal behavior of a poly(arylene ether) composition containing 2,2'-bis(phenylethynyl) biphenyl-5,5'-dioxy linkages under conditions of dynamic mechanical analysis.

As illustrated in FIG. 4, analysis of the first DSC scan on the film recorded a distinct exotherm having a maximum temperature ("$T_{max}$") at 226° C., with an onset coinciding with a shallow endotherm (softening point) at a temperature of 133° C. Although not wishing to be bound by any theory, we believe that the exotherm at 226° C. ($\Delta H$=304.6 J/g) is likely due to the IMC reaction that rigidizes the bis (phenylethynyl)biphenyl units.

Upon subjecting the samples to a second DSC scan, neither of these exotherms and endotherms were apparent, and no new features assignable to a glass transition were observed between 200° and 300° C. A mild calorimetric change was seen in the 350°–400° C. range, but it was ambiguous. At temperatures of 350°–400° C., a possible position for a Tg at a temperature of about 360° C. and an exotherm (which was ~10% of the magnitude of the exotherm recorded at 226° C.) at 393° C. We also believe that this mild exotherm likely corresponds to the cross-linking reaction of residual phenylethynyl groups left over from the IMC reaction. We further believe that the combination of these IMC reactions contributes to the high Tg of the composition of the present invention.

The results of DMA and TMA analysis confirmed that the film possesses a high Tg, i.e. greater than 350° C. FIG. 6 illustrates the DMA results.

The MIM dielectric constant for DOM structures was higher than that for the capped structures due to the interaction between the polymer and the metal during the testing procedure. Such interactions were eliminated by the use of the capping layer in the capped structures, the results for which thus more accurately represent the dielectric constant property of the polymer film.

Example 3

Preparation of Free Standing Films

Fifty mL of the solution of Example 1 was concentrated to 25% solids content and then poured onto the surface of an optically polished quartz plate having a diameter of 10 cm to cover an area of about 1 cm by 6 cm. The solution was then leveled across the plate's surface with a doctor's blade set at a nominal setting, typically in the range of 35 $\mu$m to 80 $\mu$m, then baked on a hot plate. The coated plate was exposed to a variant temperature increasing at a rate of 5° C./min until the hot plate reached a temperature of 150° C., at which point it was baked at a constant temperature for about 2 hours.

In order to cure the film, the baked coated plate was then heated, in the presence of nitrogen, inside the furnace chamber of a Tencor Flexus Model 2410 stress gauge at a variant temperature increasing at a rate of 5° C./min until the furnace reached a temperature of 425° C., then heated for 1 hour at 425° C., and then cooled at a variant temperature decreasing at a rate of 2°/min until the temperature in the furnace was 25° C.

The coated plate was then placed in water set at a temperature of 90° C. for 1 to 3 hours after which time the film was removed from the plate. The resulting film possesses a thickness of 30 to 60 $\mu$m, as desired.

It is evident from this Example that free standing film samples of poly(arylene ether) FLARE™ 1.51 can be routinely prepared to a thickness ranging from about 30 $\mu$m to about 60 $\mu$m.

Example 4

2,2'-Dibromo-5,5'-dimethoxybiphenyl from Bromination of 3,3'-Dimethoxybiphenyl A 1.132-kb quantity (5.290 Mol) of 3,3'-dimethoxybiphenyl and 12 L of acetonitrile were charged into a reaction vessel set at a temperature of 25° C. under ambient pressure with stirring. The temperature of a surrounding external cooling bath was then lowered such that the internal temperature of the reaction mixture was reduced to approximately 15° C.

To this solution under cooling, 1.883 kg (10.58 Mol) of solid N-bromosuccinimide ("NBS") were added over a four-hour period while maintaining the reaction mixture temperature at 15° C. After removing the cooling bath, the reaction mixture was then stirred at ambient temperature for approximately 15 hours.

The crystallized product was isolated from the mother liquor by suction filtration in a Büchner filter funnel using approximately 200 torr of pressure, washed with approximately 2 L of acetonitrile, then dried under ambient conditions while still on the Büchner filter for about 1 hour and then in an oven under 10 torr of pressure and set at a temperature of about 60° C. for about 16 hours. The yield of the product was 1.338 kg (68%; theoretical yield was 1.968 kg). The melting range matched the literature value of 134–136° C. The purity of the product, which was determined by gas chromatography, using a Hewlett-Packard Model 5890 gas chromatograph equipped with a standard 2-meter glass capillary column ("GC"), was 98.4%.

After concentrating the mother liquor on a Büchi rotary evaporator, the precipitated solids therefrom were partitioned between heptane and water phases at reflux. The succinimide-containing water layer was then discarded, and the wet heptane solution layer was dried by simple azeotropic distillation at a pot temperature of about 80° C., while the distillate mixture was collected in the Dean-Stark trap until the heptane phase appeared clear and virtually no more water droplets separated in the cooled distillate. After treating the anhydrous heptane with about 20 grams of activated charcoal such as "Darco G-60" from Aldrich Chemical Co., the solution was filtered through a bed of a "Celite" filtering aid, also available from Aldrich, and placed inside a Büchner filter funnel. The heptane filtrate was then cooled to allow crystallization of a tan-colored solid (360 g, 18% yield), which was then distilled on a Kugelrohr distillation device at 2–5 torr pressure, to give 300 g (15% yield) of a colorless solid. GC analysis indicated a >98% purity, suitable for the Grignard reaction.

The heptane mother liquor was concentrated to yield 197 g of a solid residue. GC analysis of the solid revealed the presence of a mixture of mono and dibromo derivatives.

This example illustrates an improved method for producing 2,2'-Dibromo-5,5'-dimethoxybiphenyl which results in yields that are significantly higher than those of the prior art processes.

Example 5

2,2'-Diiodo-5,5'-dimethoxybiphenyl from 2,2'-Dibromo-5,5'-dimethoxybiphenyl via Grignard Halogen Exchange Preparation of Grignard Reagent Approximately 5 L of tetrahydrofuran (THF) (Aldrich 14,7222-2) were mixed with 0.5 L of a 65% solution of sodium bis(2-methoxyethoxy)aluminium hydride in toluene, a reagent available from Aldrich Chemical Co. under the tradename "Red-AI®" (19,610-3), under ambient conditions. The mixture was heated to reflux and distilled under nitrogen to produce anhydrous THF.

A reaction vessel equipped with a mechanical stirrer was charged with 110 grams (4.58 Mol) of magnesium tumings (Aldrich 20,909-5). A 500-mL portion of a solution containing 700 grams (1.88 Mol) of the 2,2'-dibromo-5,5'-dimethoxybiphenyl produced in Example 4 in 3,000 mL of dry THF was added to the vessel. The reaction mixture was heated for about 10 minutes with a heating mantle to a temperature of 60° C. while 2 grams of an iodine reaction initiator was added thereto. Then, the rest of the THF-2,2'-dibromo-5,5'-dimethoxybiphenyl solution was added dropwise to the reaction mixture at a rate sufficient to maintain reflux. After heating the mixture at reflux (60° C.) for one hour, 1,500 mL of dry THF were added thereto while maintaining the temperature of the reaction mixture at about 60° C.

Iodination

A 1,050-gram (4.134 Mol) quantity of iodine and 3,000 ml of anhydrous THF were charged into a 22-L reaction flask equipped with mechanical stirrer which was maintained at a temperature of 0° C. via an external cooling bath. The above Grignard reagent was added thereto via a double tipped syringe over a period of 3 hours. The reaction mixture was then stirred for an additional three hours.

After slowly adding 10 L of a 20% aqueous sodium bisulfite solution to the reaction mixture, the resulting mixture was stirred for 16 hours. The solid product was collected therefrom via the suction filtration procedure set forth in Example 4. The filtered cake was washed four times with 1,000 mL of water, then dried in the vacuum oven described in Example 4 for 24 hours at 60° C. In general, 800–824 g (92–94% yield; theoretical yield is 876 g) of 2,2'-Diiodo-5,5'-dimethoxybiphenyl (93% purity as determined by GC) was produced.

Example 6

2,2'-Diiodo-5,5'-bis(tetrahydropyranyl)biphenyl via Tetrahydropyranylation of 2,2'-Diiodo-5,5'-dihydroxybiphenyl A 250-mL (230.5 grams; 2.83 Mol) quantity of dihydropyran (Aldrich 310.620-8) was charged into a reaction flask equipped with a mechanical stirrer at 25° C. and ambient pressure. Over a minimum of three hours, 200 g 2,2'-diiodo-5,5'-dihydroxybiphenyl was added in the absence of catalyst.

Samples of the reaction mixture were analyzed by thin-layer chromatography ("TLC") using a hexane-ethyl acetate eluant in a 5:1 molar ratio. When the TLC results showed complete disappearance of starting materials, 450 mL of heptane were charged into the reaction vessel, and the resulting mixture was stirred for 16 hours. The solid product was collected via the suction filtration procedure set forth in Example 4, washed twice with 200 mL of heptane, and then dried in the vacuum oven used in Example 4 at a temperature of 50° C. for 24 hours. A 220-g quantity (80% yield) of 2,2'-Diiodo-5,5'-bis(tetrahydropyranyl)biphenyl was produced having a melting point of 116.5–117.4° C. (literature melting point of 112° C. to 113° C. as set forth in Lindley).

Example 7 illustrates a reliable method of producing 2,2'-Diiodo-5,5'-bis(tetrahydropyranyl)biphenyl at a yield higher than that reported in the prior art, i.e. "Lindley".

Example 8

An Exemplary Synthesis of Poly(arylene ether) Solution 1.0000 Mol of decafluorobiphenyl followed by 0.6633 Mol of 2,2'-bis(phenylethynyl)-5,5'-dihydroxy-biphenyl were added to a nitrogen purged reaction vessel containing 600 mL of N,N-dimethylacetamide ("DMAC"). The mixture was heated to a temperature of 110° C. using an internal Teflon®-coated thermocouple. Potassium carbonate (2.48 Mol) was then added to the stirred reaction mixture while maintaining its internal temperature at 110° C.

After four hours of stirring, 0.3317 Mol of 1,5-dihydroxynaphthalene were added thereto with stirring. After about 17 hours of additional stirring, the mixture was cooled to ambient temperature then poured into 2 L of water. The resulting white polymer precipitate was filtered via the suction filtration procedure set forth in Example 4, washed once with 200 mL of water, placed inside an extraction thimble in the Soxhlet tower, and continuously extracted with a recycling stream of 15% ethanol/water sustained by volatilizing the solvent up to the water-cooled condenser, condensing the solvent to drop into the thimble inside the Soxhlet tower, and siphoning back to the heating pot. Extraction was continued for 2 to 3 days. After the polymer was rinsed with 500 mL of methanol and dried under vacuum at 70° C. for 15 hours, it was then dissolved in cyclopentanone at the desired solids content. The solution was filtered through the series of 4 Teflon cartridges with 1.0, 0.5, 0.2 and 0.1 μm porosities.

We claim:

1. A process for producing a poly(arylene ether) composition comprising:

reacting a compound of Formula A

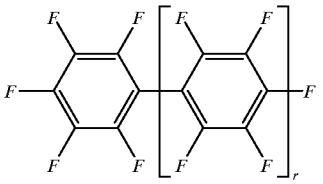

where r is an integer of from about 0 to about 50, or a compound of Formula D

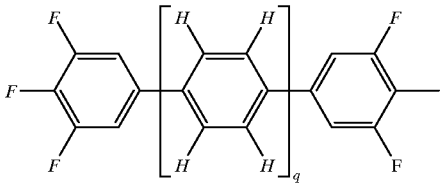

wherein q is an integer of from about 0 to about 49 with a compound of formula B

HO—R—OH wherein R is an aromatic nucleus which imparts a glass transition temperature of greater than 300° C. to the composition, under conditions sufficient to produce the composition.

2. The process of claim 1 wherein r is from about 1 to about 4.

3. The process of claim 2 wherein said compound of the formula A is comprised of hexafluorobenzene, decafluorobiphenyl having ortho-, meta-, and para-catenation between its aromatic rings, perfluoro-para-terphenyl, perfluoro-meta-terphenyl, perfluoro-ortho-terphenyl, tetradecafluoro-para-terphenyl, tetradecafluoro-meta-terphenyl, tetradecafluoro-ortho-terphenyl, octadecafluoro-para,para-terphenyl or all positional isomers thereof due to ring catenation, perfluoro-para,para-tetraphenyl and all positional isomers thereof due to ring catenation, or mixtures thereof.

4. The process of claim 1 wherein q is from about 0 to about 3.

5. The process of claim 1 wherein the temperature of said reaction is from about 100° C. to about 175° C.

6. The process of claim 1 wherein the molar ratio of compounds having formula A or formula D to compounds having Formula B is about 1:1 to about 1:0.95.

7. A process of producing a composition of formula C

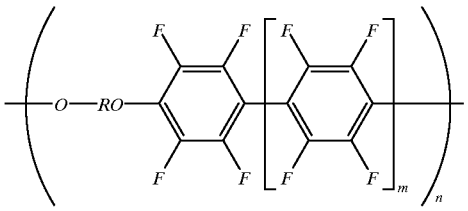

wherein m is an integer of from about 0 to about 50; and n is an integer of from about 1 to about 200; comprising:

reacting a compound of Formula A

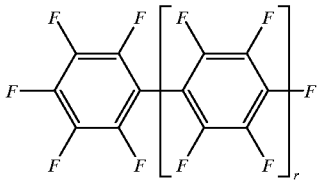

wherein r is an integer of from about 0 to about 50 with a compound of formula B:

HO—R—OH wherein R comprises:

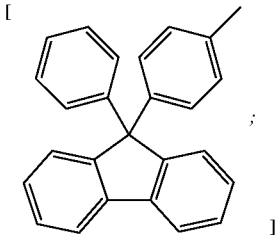

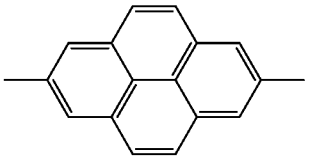

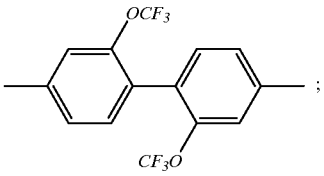

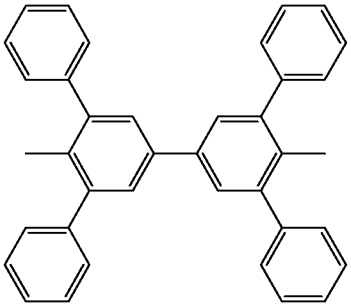

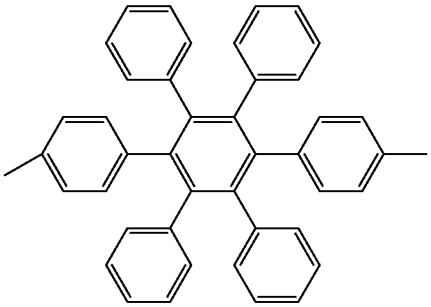

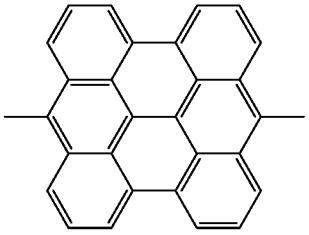

-continued

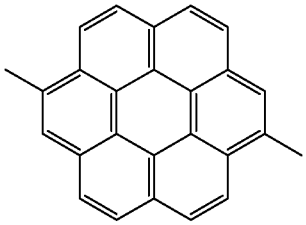

;

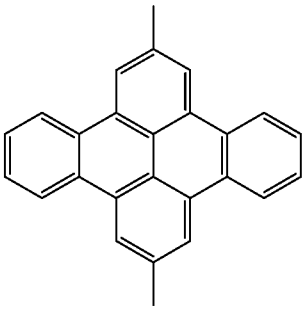

;

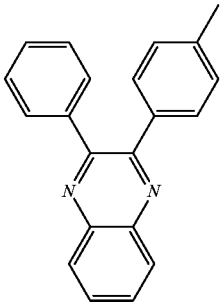

;

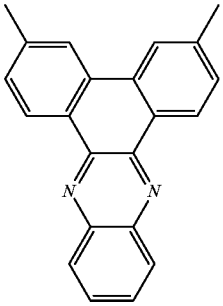

;

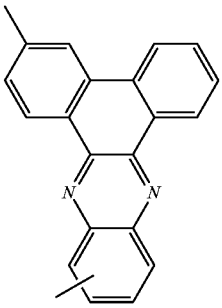

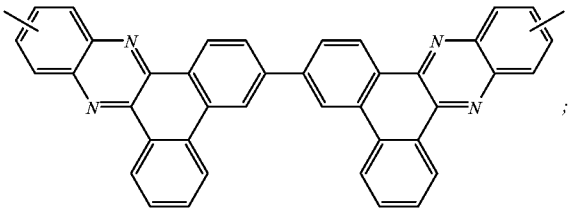

;

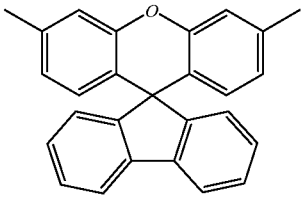

;

-continued

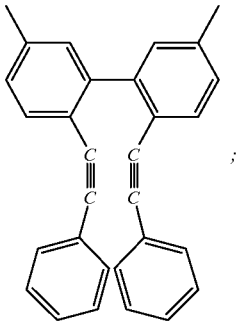

;

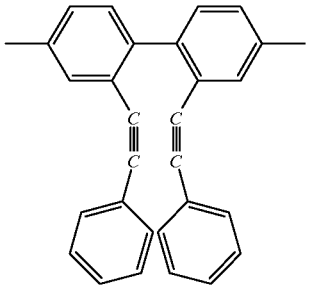

;

or mixtures thereof, under conditions sufficient to produce the composition.

8. The process of claim 7 wherein said compound having formula B is comprised of:

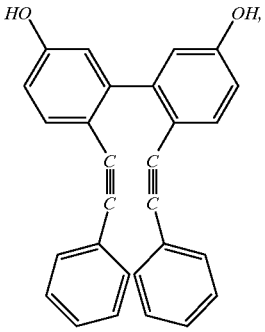

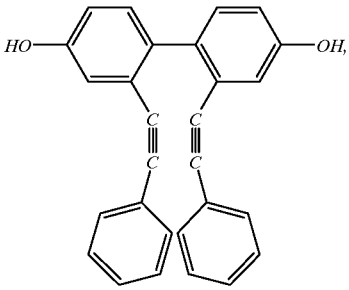

or mixtures thereof.

9. The process of claim 7 wherein said R group is comprised of 2,2'-bis(phenylethynyl)-4,4'biphenylenediyl or 2,2'-bis(phenylethynyl)-5,5'-biphenylenediyl.

10. The process of claim 7 wherein m is from about 0 to about 4.

11. The process of claim 7 wherein n is from about 1 to about 200.

12. The process of claim 1 further comprising recovering the poly(arylene ether) composition.

13. The composition produced according to the process of claim 1.

14. The composition produced according to the process of claim 12.

15. The process of claim 1 wherein the compound having formula A and a first compound having formula B are further reacted with a compound containing formula Z under conditions sufficient to produce a product corresponding to formula C"

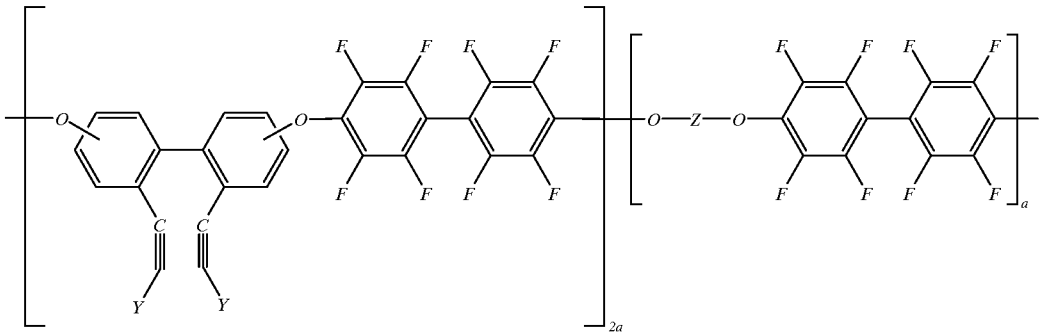

wherein

Z is comprised of 1,5-naphthalenediyl, an aromatic nucleus in a second compound having formula B which is independent from said first compound having formula B, or mixtures thereof;

Y is independently

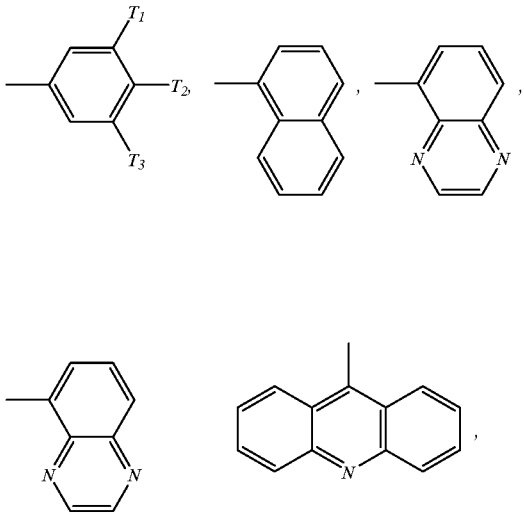

-continued

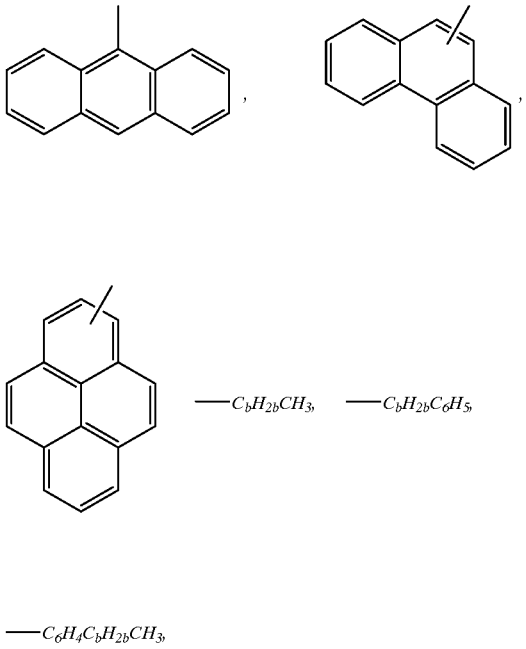

or mixtures thereof:

$T_1$, $T_2$, and $T_3$ are independently comprised of an alkyl having from about 1 to about 10 carbons, an aryl, or mixtures thereof; a is independently an integer from about 1 to about 200; and b is an integer of from about 0 to about 20.

16. The process of claim 15 wherein said product is

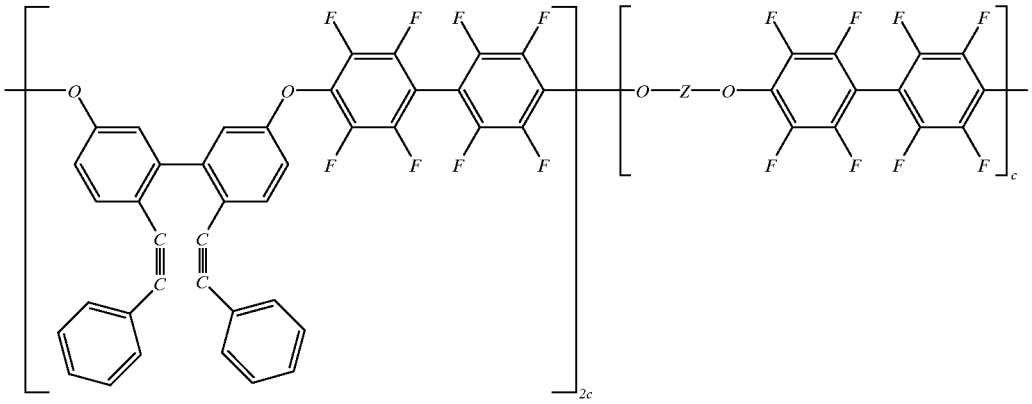

wherein c is independently an integer from about 1 to about 200; and Z is comprised of 1,5-naphthalenediyl, an aromatic nucleus in a second compound having formula B which is independent from said first compound having formula B, or mixtures thereof.

17. The process of claim 15 wherein an inorganic base is optionally reacted with said compound having formula A, said first compound having formula B, and said compound containing formula Z.

18. The process of claim 17 wherein said inorganic base is potassium carbonate.

19. The process of claim 17 wherein the molar ratio of said compound having formula Z to said first compound having formula B is about 20 to about 1.

20. The process of claim 17 wherein Z is 1,5-naphthalenediyl.

21. The process of claim 1 wherein the compound having formula D and a first compound having formula B are further reacted with a compound containing formula Z under conditions sufficient to produce a product corresponding to formula D"

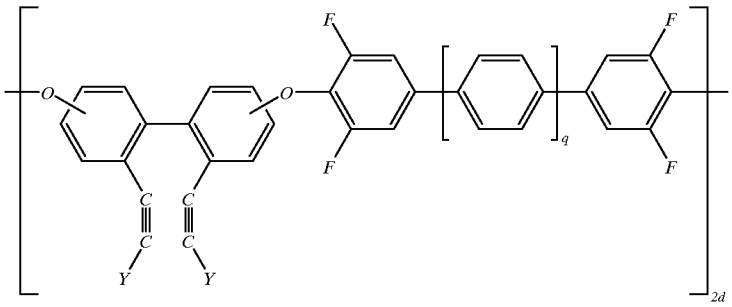

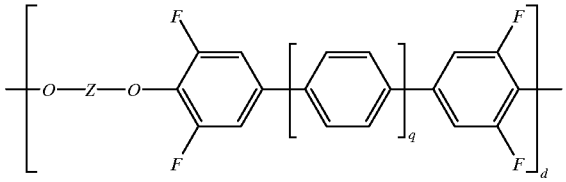

wherein

Z is comprised of 1,5-naphthalenediyl, an aromatic nucleus in a second compound having formula B which is independent from said first compound having formula B, or mixtures thereof;

Y is independently

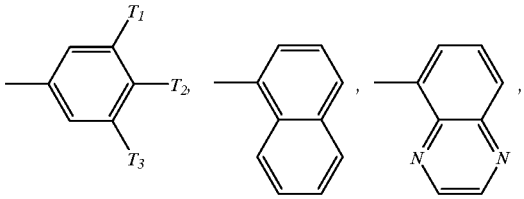

-continued

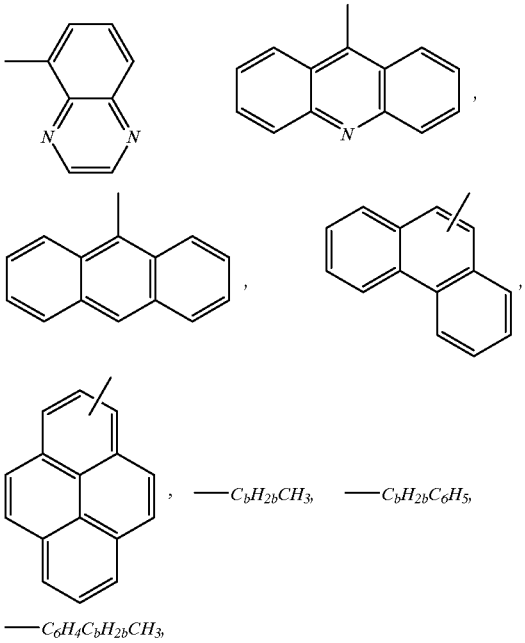

$T_1$, $T_2$, and $T_3$ are independently comprised of an alkyl having from about 1 to about 10 carbons, an aryl, or mixtures thereof; d is independently an integer from about 1 to about 200; b is an integer of from about 0 to about 20; and q is independently an integer of from about 0 to about 20.

22. A film comprised of the composition of claim 13.

23. A substrate coated with the composition of claim 13.

24. A film comprised of the composition of claim 14.

25. A microelectronic device containing the film of claim 22.

26. A microelectronic device containing the film of claim 24.

27. A composition having formula C

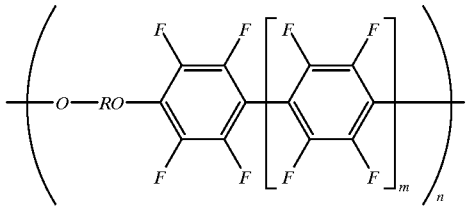

R is an aromatic nucleus which imparts a glass transition temperature of greater than 300° C. to the composition;

m is an integer of from about 0 to about 50; and n is an integer of from about 1 to about 200.

28. A composition having formula D":

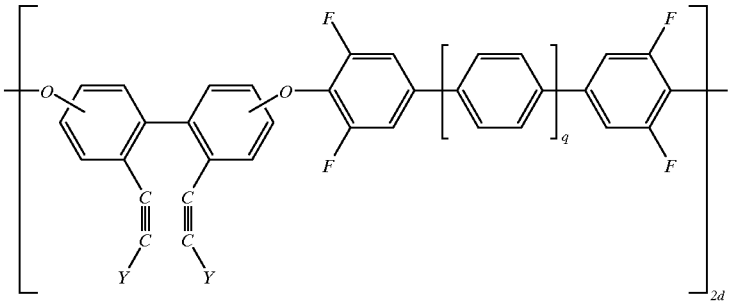

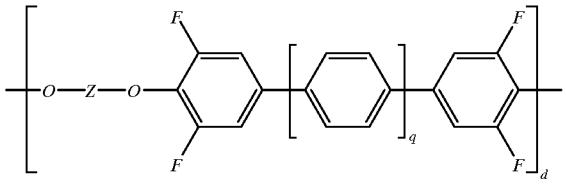

wherein

Z is comprised of 1,5-naphthalenediyl, an R group wherein R is an aromatic nucleus which imparts a glass transition temperature of greater than 260° C. to the composition, or mixtures thereof;

Y is

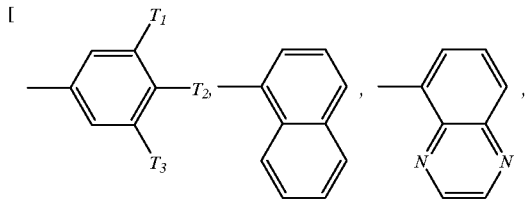

-continued

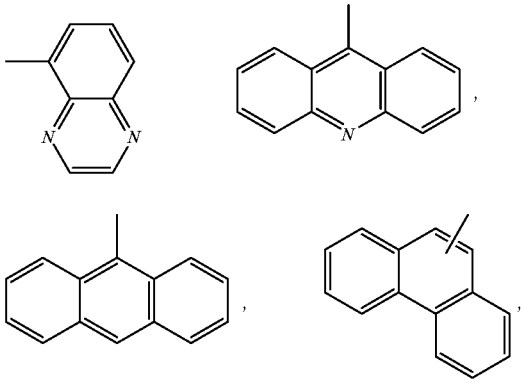

-continued

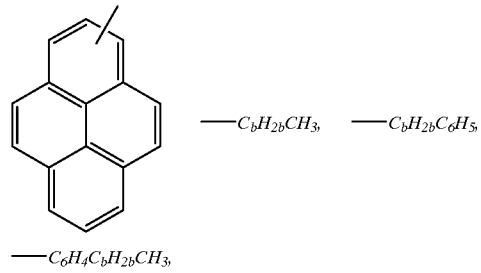

1

$T_1$, $T_2$, and $T_3$ are independently comprised of an alkyl having from about 1 to about 10 carbons, an aryl, or mixtures thereof;

d is independently an integer from about 1 to about 200;

b is an integer of from about 0 to about 20; and q is an integer of from about 0 to about 20.

29. A composition having formula C":

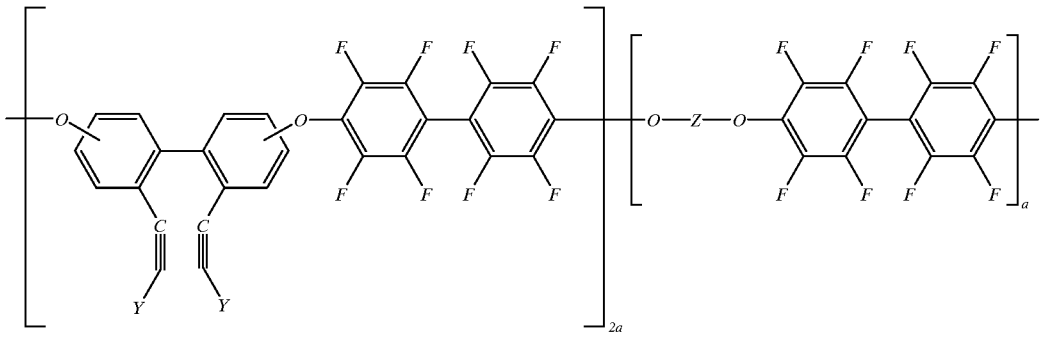

wherein

Z is comprised of 1,5-naphthalenediyl, an R group wherein R is an aromatic nucleus which imparts a glass transition temperature of greater than 260° C. to the composition, or mixtures thereof;

Y is independently

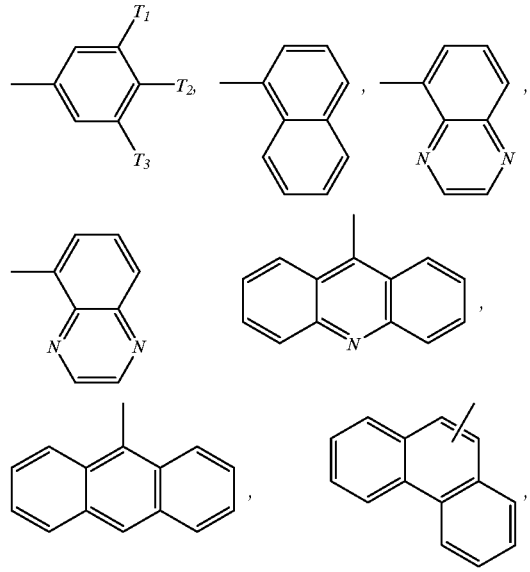

-continued

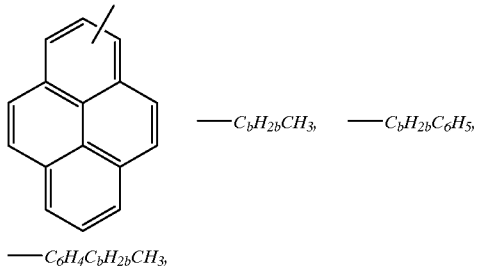

and mixtures thereof;

$T_1$, $T_2$, and $T_3$ are independently comprised of an alkyl having from about 1 to about 10 carbons, an aryl, or mixtures thereof;

a is independently an integer from about 1 to about 200; and b is an integer of from about 0 to about 20.

30. A process for producing a fluorinated poly(arylene ether) mixture for spin-coating onto a substrate comprising:

a) forming a solution from a composition of the formula C

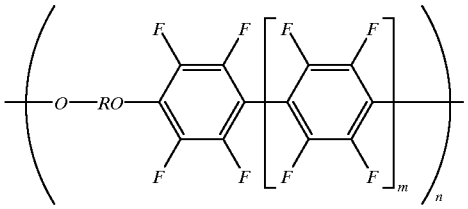

wherein

R is an aromatic nucleus which imparts a glass transition temperature of greater than 300° C. to the composition;

m is an integer of from about 0 to about 50; and n is an integer of from about 1 to about 200 and an aprotic solvent; and b) filtering the solution through at least one filter having a pore size of about 0.1 micrometers.

31. The process of claim 30 wherein said aprotic solvent is comprised of cyclic ketones, cyclic amides, and mixtures thereof.

32. The process of claim 30 wherein said aprotic solvent is comprised of cyclopentanone, cyclohexanone, cycloheptanone, cyclooctanone, N-methylpyrrolidinone, N-cyclohexyl-pyrrolidinone, or mixtures thereof.

33. The process of claim 32 wherein said solvent is cyclopentanone.

34. The process of claim 30 wherein said solution is comprised of, based upon the total weight of said solution, from about 50% to about 99% of said solvent and from about 1 to about 50% of said fluorinated poly(arylene ether) composition.

35. The process of claim 34 wherein said solution is comprised of, based upon the total weight of said solution, from about 80% to about 97% of said solvent and from about 3 to about 20% of said fluorinated poly(arylene ether) composition.

36. The process of claim 30 wherein said solution is filtered sequentially through at least two filters, each of said filters having a different pore size.

37. A process for producing a cured, coated substrate comprising:

a) forming a solution from a composition of the formula C

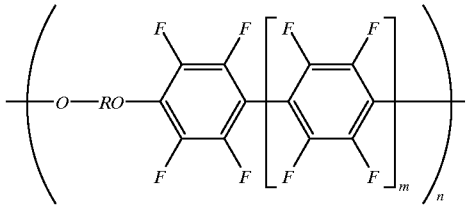

wherein

R is an aromatic nucleus which imparts a glass transition temperature of greater than 300° C. to the composition;

m is an integer of from about 0 to about 50; and n is an integer of from about 1 to about 200 and an aprotic solvent;

b) filtering the solution;

c) applying the solution of step b via spin-coating onto a substrate to form a film thereon; and d) heating the film of step c under conditions sufficient to cure the film.

38. A composition having the formula:

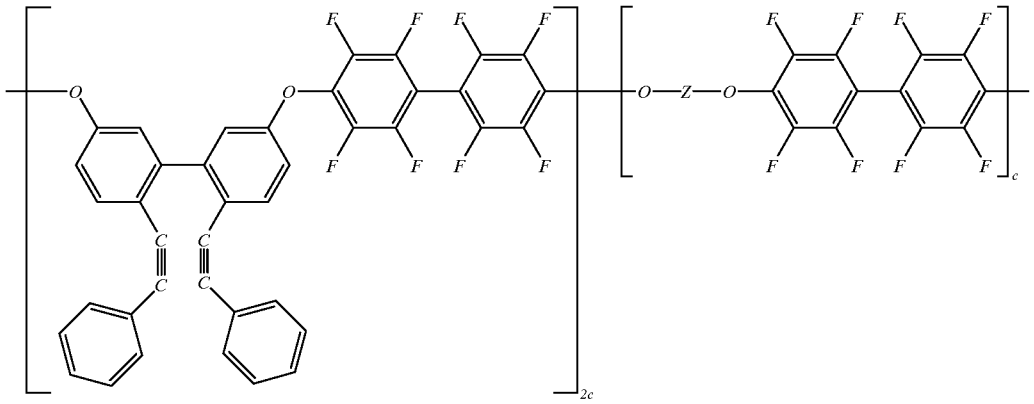

wherein c is an integer from about 1 to about 200; and

Z is comprised of 1,5-naphthalenediyl, an R group wherein R is an aromatic nucleus which imparts a glass transition temperature of greater than 260° C. to the composition, or mixtures thereof.

39. A film comprised of the composition of claim 27.

40. A substrate coated with the film of claim 39.

41. A microelectronic device containing the film of claim 39.

* * * * *